United States Patent [19]

Shashoua et al.

[11] Patent Number: 5,930,373
[45] Date of Patent: Jul. 27, 1999

[54] METHOD AND SYSTEM FOR ENHANCING QUALITY OF SOUND SIGNAL

[75] Inventors: Meir Shashoua, Tel-Aviv; Daniel Glotter, Reut, both of Israel

[73] Assignee: K.S. Waves Ltd., Tel-Aviv, Israel

[21] Appl. No.: 08/832,812

[22] Filed: Apr. 4, 1997

[51] Int. Cl.⁶ .................................................... H03G 5/00
[52] U.S. Cl. ............................................. 381/98; 381/61
[58] Field of Search ................................. 381/1, 17, 18, 381/19, 61, 63, 98, 97, 103

[56] References Cited

U.S. PATENT DOCUMENTS

| | | | |
|---|---|---|---|
| 4,698,842 | 10/1987 | Mackie et al. | 381/98 |
| 4,769,840 | 9/1988 | Saisho | 381/98 |
| 4,769,848 | 9/1988 | Eberbach | 381/98 |
| 5,230,022 | 7/1993 | Sakata | 381/98 |
| 5,325,435 | 6/1994 | Date et al. | 381/98 |
| 5,325,440 | 6/1994 | Fujisawa et al. | 381/98 |
| 5,388,159 | 2/1995 | Sakata | 381/98 |
| 5,668,885 | 9/1997 | Oda | 381/98 |
| 5,754,666 | 5/1998 | Nakagawa | 381/61 |
| 5,771,296 | 6/1998 | Unemura | 381/98 |

FOREIGN PATENT DOCUMENTS

| | | | |
|---|---|---|---|
| 59-105707 | 6/1984 | Japan | 381/61 |
| 63-314099 | 12/1988 | Japan | 381/98 |
| 2-311006 | 12/1990 | Japan | 381/98 |
| 4-109799 | 4/1992 | Japan | 381/98 |

*Primary Examiner*—Curtis A. Kuntz
*Assistant Examiner*—Xu Mei
*Attorney, Agent, or Firm*—Browdy and Neimark

[57] ABSTRACT

An apparatus for conveying to a listener a pseudo low frequency psycho-acoustic sensation (Pseudo-LFPS) of a sound signal, including: frequency unit capable of deriving from the sound signal high frequency signal and low frequency signal (LF signal) that extends over a low frequency range of interest. Harmonics generator coupled to the frequency generator and being capable of generating, for each fundamental frequency within the low frequency range of interest, a residue harmonic signal having a sequence of harmonics. The sequence of harmonics, generated with respect to each fundamental frequency contains a first group of harmonics that includes at least three consecutive harmonics from among a primary set of harmonics of the fundamental frequency. Loudness generator coupled to the harmonics generator and being capable of bringing the loudness of the residue harmonic signal to match the loudness of the low frequency signal. Summation unit capable of summing the residue harmonic signal and the high frequency signal so as to obtain psychoacoustic alternative signal.

23 Claims, 11 Drawing Sheets

METHOD AND SYSTEM FOR ENHANCING QUALITY OF SOUND SIGNAL

FIELD OF THE INVENTION

The present invention is in the general field of psychoacoustics and concerns enhancing the quality of sounds sensed by the listener. The invention is focused specifically in the field of enhancing the quality of the bass partial of the sound that is produced by an electro-acoustic transducer as perceived by the listener.

GLOSSARY

There follows a glossary of terms, some of which are conventional and others have been coined (terms which have been coined are underlined):

Electro-acoustic transducer—a device that converts electric signal to audible sounds. Electro-acoustic transducer includes all kinds of commercially available devices such as high quality stereo speakers desk-top speakers and earphones;

Pitch—Pitch in this context is defined as that attribute of auditory sensation in terms of which sounds may be ordered on a musical scale Ref. 1, pp. 288.

Loudness—this is an intensive attribute of an auditory sensation in terms of which sounds may be ordered on a scale extending from quiet to loud. Ref. 1 pp. 287.

Sound Pressure Level (SPL)—The level of sound in decibels (dB)—this is a physical measure;

Loudness level—the loudness level, of a sound, in phones, is the sound pressure level (SPL) in dB of a pure tone of frequency 1 Khz which is judged by the listener to be equivalent in loudness—this is a sensory measure;

Phon—the unit of loudness level;

Timbre—Timbre is that attribute of auditory sensation in terms of which a listener can judge that two sounds similarly presented and having the same loudness and pitch are dissimilar. Put more simply it related to the quality of a sound;

SPL Dynamics—The dynamics of a sound in terms of it's SPL in dB; in the context of the invention, dynamics stands for "range of change".

Loudness Dynamics—The dynamics of a sound in terms of it's Loudness in Phones;

Downwards-Expander—A device that expands the dynamics of it's input downwards, typically by some constant expansion ratio;

Upwards Compressor—A device that compresses the dynamics of it's input upwards, typically by some constant compression ratio—i.e. the opposite of a downwards expander;

SPL-to-Phone expansion ratio 'R(f)'—the ratio by which a range of SPL values in dBs is expanded into the corresponding range of loudness level in phones. This ratio depends on the frequency. This is a sensory measure;

Residue Expansion Ratio—the expansion ratio by which the 'Residue Harmonics Signal' (see definition below) should be expanded relative to the 'Low Frequency Signal' is designated the 'Residue Expansion Ratio'. As will be noted below, natural residue expression ratio and modified expansion ratio will be used in the context of the invention.

Psyco-acoustic—the psychoacoustics concern the subjective manner in which the listener senses sounds. The sensation is contingent upon many physiological factors such as the characteristics of the membrane in the ear, the firing rate of the neurons in the brain that are governed by respective frequencies of the sensed sound and other factors, as known per se. Three main attributes of psychoacoustic sensation that are relevant to the present invention are loudness, pitch and timbre.

The field of psychoacoustic has been elucidated extensively in the literature and although it does not constitute an aspect of the invention ipso facto, a detailed discussion of this field can be found in Ref. 1.

Low frequency psycho-acoustic sensation (LFPS)—the psyco acoustic sensation that stems from the low frequency range of a sound signal, assuming that essentially no physical and electro-acoustic limitations prevail.

Pseudo low frequency psycho-acoustic sensation (Pseudo-LFPS)—a psyco acoustic sensation that stems from frequencies other than the low frequency range of the original sound signal and which attempts to resemble the low frequency psycho-acoustic sensation.

Residue pitch effect (referred to also as the phenomenon of the missing fundamental)—Generally speaking, the residue pitch effect is a psycho-acoustic effect by which sensation of low pitch is accomplished by incorporating harmonics of the fundamental (low) frequencies in the sound whilst removing the fundamental frequency itself.

The harmonics that are incorporated in the signal are referred to in the context of the invention as Residue Harmonics Signal (RH-Signal) and the resulting signal is referred to in the context of the invention as Psyco-acoustic Alternative Signal (PA-signal).

In other words, the residue pitch effect conveys to the listener the psychoacoustic sensation of a low pitch without having to physically transmit low frequencies acoustically.

The residue pitch effect which is referred to also as the "phenomenon of the missing fundamental" is exemplified with reference to a high range of the bass frequency's range, i.e. 200 Hz. Thus, in the specified Ref. 1. publication the author describes the phenomenon of the missing fundamental, to wit, "consider, as an example, the sound consisting of short impulses (clicks) occurring 200 times per second. This sound has a low pitch, which is very close to the pitch of 200 Hz pure tone, in the sharp timbre. It may shown to contain harmonic frequencies of 200, 400, 600, 800 . . . Hz., etc. However, it is possible to remove (electronically) the 200 Hz component, and it is found that the pitch does not alter; the only result is a slight change in the timbre of the tone".

A detailed discussion of this effect is given, e.g. in Chapter IV of Ref. 1.

Bass frequency range—a frequency range of substantially 20–300 Hz.

Low frequency range of interest—A range of frequencies that is subject to the Pseudo-LFPS. The specified range may be wholly contained in said Bass frequency range, or partially overlapping said Bass frequency range. The low frequency range of interest may extend over one, or if desired two or more distinct sub-ranges, including discrete frequencies. Each frequency in said low frequency range of interest is regarded as fundamental frequency.

Low frequency sound signal of interest (LFSignal)—that part of sound signal that falls in the Low frequency range of interest.

Pseudo Extension of Frequency Response—The subjective effect of the Pseudo-LFPS.

Residue harmonics signal (RHSignal)—A sequence of harmonics of a fundamental frequency not including the fundamental frequency. According to the invention the sequence of harmonics is subject to constraints as expounded upon below.

Psyco-acoustic Alternative signal (PASignal)—The resulting signal, according to the invention that conveys to the listener a Pseudo-LFPS.

Loudness Matching Attribute—The attribute by which two sound signals are judged to have the same loudness-dynamics. The loudness matching procedure of the invention preferably but not necessarily accomplishes also the same loudness level. Thus, the loudness matching attribute is met if the loudness dynamics is retained. Other known procedures such as applying constant gain in (dB) whilst affecting loudness level do not affect the loudness matching attribute.

Loudness Matching Procedure—A procedure applied to one of two sound signals in order to accomplish the loudness matching attribute.

REFERENCES

There follows a reference to list of publications, referred to, occasionally, in the following description:

1) Brian C. J. Moore, An introduction to the psychology of hearing. 1982.
2) John R. Pierce, The Science of Musical Sound. 1992.
3) PC Magazine, January 1996. pp.159 . . . 199 *"Speakers: The Sound and the Fury"*.

BACKGROUND OF THE INVENTION

Sound, e.g. music, normally consists of a wide range of frequencies which contain also bass components extending over a bass frequency range. The bass components play an important role in music. Thus, for example, a piano keyboard covers a wide range of frequencies with more than a quarter of its notes allocated to frequencies below 200 Hz. Various "sound effects" that are used in film, video clips, multimedia ("MM") games and others, contain frequencies below 100 Hz; typical examples being the sound of cars, helicopters, motor cycle engines, cannon fire, bomb explosions etc. (see also Ref. 2. FIG. 2–4 pp.18–19).

Whilst, as specified, bass plays an important role in sounds, there are inherent difficulties in reproducing acoustically (i.e. through elecrto-acoustic transducers) low frequencies and accordingly, the resulting low-frequencies as sensed by the listener (i.e. low frequency psyco-acoustic sensation) is adversely affected owing to physical limitations of the electro-acoustic transducer and psychoacoustic reasons.

Consider, for example, the sound of a piano. This sound contains low and high frequencies which give rise to low and high frequency psyco-acoustic sensation respectively.

Reproducing a recording of such a sound through electro-acoustic transducers will degrade the low frequency psychoacoustic sensation due to physical and psyco-acoustic limitations associated with the low frequency.

As to the physical and psyco-acoustic limitations, the former resides in the inherent low efficiency of electro-acoustic transducers in the low frequency range. The specified low efficiency stems from the relatively small size of the transducer, relative to the acoustic wavelength of the low frequencies. Thus, the wavelength of low frequency acoustic waves in the range of 20–300 Hz is between 10 to 1 meters, respectively. The physical size of the electro-acoustic transducer is, normally, much smaller than the wavelength in the low frequency range and in some cases the size of the electro-acoustic transducers amounts to about $\frac{1}{100}$ of the low frequency wavelength. This physical shortcoming results in that the efficiency of the electro-acoustic transducer in the low frequency range is significantly lower as compared with its efficiency in the higher frequency range, thereby degrading the low frequency psyco-acoustic sensation (LFPS).

The other aspect which further degrades the LFPS resides in the field of psychoacoustics. As is well known in the psychoacoustic field, frequencies below about 300 Hz (and above about 5,000 Hz) are treated by the ear's physiology in a non-linear manner. Consequently, in a complex tone sound, (i.e. containing a wide range of frequencies), the balance between low, medium and high frequency ranges changes as a function of the overall sound level. Thus, when lowering the overall sound pressure level (SPL) of music the loudness level of the mid-high frequency range will be attenuated correspondingly whereas the loudness of the low frequency range will be attenuated by a different, higher factor. Therefore, it is difficult to control the manner in which the listener will perceive the loudness attribute of the low frequency psychoacoustic sensation (LFPS). (see also Ref. 1. ch 2.3 pp. 46)

Prior art techniques attempt to cope with degradation of LFPS, i.e. by compensating for the physical and psyco-acoustic limitations by means of treating the low frequency range signal.

The degradation in the LFPS due to physical and psychoacoustic factors as discussed herein is exhibited in commercially available electro-acoustic transducers, and particularly in the so-called desk-top multimedia speakers.

Desk-top MultiMedia speakers are normally coupled to a conventional personal computer (P.C.) and are characterized by being small in size, (due to the limited physical space that is allocated therefor on the desk-top). Desk-top-MM speakers are normally designed to work in a relatively low overall loudness level and are generally of a medium or low quality, as compared to conventional home stereo speakers, by virtue, inter alia, of competitive pricing constraints. The latter characteristics give rise to low efficiency of MM speakers. FIG. 1 (taken from Ref. 3.), show eight frequency response curves of respective good quality eight commercially available MM speakers. As clearly shown, all speakers demonstrate a significant degradation in their efficiency below about 150 Hz.

Notwithstanding the specified limitations, the circulation of desk-top MM speakers have received a boost in recent years, due to the ever-increasing popularity of multimedia applications in the P.C. environment. The wide circulation of the multimedia speakers on the one hand and the relatively low performance thereof with respect to low frequency components of the sound signals, on the other hand, have encouraged developers to enhance the low frequency efficiency of the electro-acoustic transducers thereby to accomplish pseudo extension of sound signal.

There are available other prior art techniques which attempt to cope with the physical and psychoacoustic limitations as specified herein and a brief description of these solutions is given below.

Thus, one possible approach to cope with the physical limitation of the electro-acoustic transducers is simply to boost (by a fixed gain or by dynamically controlled gain) the low frequency component of the sound signal before it is driven to electro-acoustic transducer. This solution is rendered virtually useless in medium and low quality desk-top multimedia speakers, wherein the efficiency in low frequency range may drop below $\frac{1}{100}$ (−40 dB) relative to the counterpart efficiency of the same electro-acoustic transducer at mid-high frequencies (see FIG. 1.). Thus, attempting to compensate for the difference in efficiency by amplifying the low frequency range of the signal necessitates a very high level of energy which may burn the electro-acoustic transducer or force the overall sound level to be impractically low. The drawback of the latter solution is further aggravated where lap-top multimedia computers are concerned, since the ability to compensate for low electro-acoustic transducers efficiency by boosting the energy necessarily increases power consumption. Increasing power consumption, is, of course, undesired in lap-tops, due to their limited battery capacity.

Various medium quality multimedia speaker systems employ a so-called sub-woofer. The latter is a separate device which is normally coupled to the conventional multimedia speaker and is employing a unique electro-acoustic transducer optimized for producing low frequencies. The sub-woofer is normally driven by its own power amplifier and hence it may greatly reduce the life span of the batteries that drive lap-top P.C. Moreover, sub-woofers are of relatively large size, and have normally high price tags. Thus, the price of sub-woofer systems may, in some cases, be as high as ten times the price of a conventional electro-acoustic transducer.

There follows a brief discussion in various prior art techniques, which unlike the aforementioned prior art techniques do not treat the low frequency signal directly, rather they offer alternative techniques to produce pseudo-LFPS.

1) U.S. Pat. No. 4,514,596 Garner et al.

2) U.S. Pat. Nos. 2,315,248, 2,315,249 De-Rosa et al.

3) U.S. Pat. No. 2,379,714 Hollingsworth

4) U.S. Pat. No. 4,698,842 Mackie et al. (hereinafter cited "publications").

Whilst the above citations accomplish certain level of Pseudo-LFPS they, generally, fail to come close to the low frequency psycho acoustical sensation since they do not treat adequately with all of the important attributes i.e. loudness, pitch and timbre.

In fact, none of these publications deals with matching timbre attribute and matching the loudness attributes.

Similar to the cited publications, the present invention also copes with the degradation of the LFPS by producing pseudo-LFPS, however, in departure from the specified citations, it deals properly with the specified attributes, by utilizing, inter alia, the known per se residue pitch effect and "equal loudness contours".

The equal loudness contours are depicted in FIG. 2 and are explained in detail in reference 1 (Chapter 2.3 pp. 45). As explained in the specified reference:

"Thus the loudness level of any tone is the intensity level (in dB SPL) of the 1000 Hz tone to which it sounds equal in loudness. The unit of loudness level is the phon. Some typical results are shown in FIG. 2. This figure shows equal loudness contours for loudness levels from 20 phons to 120 phons and it also includes the absolute threshold (MAF) curve. The equal loudness contours are of similar shape to the threshold curve, but tend to become flatter at high loudness levels. This means that the rate of growth of loudness differs for tones of different frequency".

It is accordingly the object of the present invention to overcome or substantially eliminate the specified drawbacks associated with low efficiency electro-acoustic transducers insofar as conveying to a listener pseudo low frequency psychoacoustic sensation is concerned.

GENERAL DESCRIPTION OF THE INVENTION

Having described the general known per se pitch residue and the equal loudness contours, the utilization thereof in the context of the invention will be elaborated, below.

There follows a brief description of the well known "ear's critical band resolution" which will clarify the utilization of a so called primary and secondary group of harmonics in the context of the pitch residue effect.

Whilst the issue of ear's critical band resolution, as such, is beyond the scope of the invention, a detailed discussion in the specified phenomenon can be found in reference 1, chapter 3.2 pp. 75.

The primary group of harmonics, i.e. the first 10, 11 or 12 harmonics of the fundamental frequency, are characterized in that each harmonic therein falls to a distinct so called "critical band" of the ear, thereby enabling the ear to resolve between any two consecutive harmonics. As is well known in the art, the critical band resolution of the ear is about F/10 where F is the fundamental frequency. The secondary group of harmonics is defined herein as harmonics above the primary group of harmonics e.g. the 15th and 16th harmonics. Since the frequency difference between any two consecutive harmonics from said secondary group is less than F/10, it readily arises that they fall in the same critical band and the ear is unable to resolve between the two.

A Residue Harmonics signal (RH-signal), having a sequence of harmonics, is generated with respect to each fundamental frequency within the Low frequency range of interest.

Said sequence of harmonics, generated with respect to each fundamental frequency should, preferably, meet the following criteria: it contains a first group of harmonics that includes at least three consecutive harmonics from among the primary set of harmonics of the fundamental frequency.

Said sequence of harmonics may also include harmonics from within the secondary group of harmonics. However, the energy of the harmonics from among said secondary group is significantly lower than the energy of the harmonics of said first group by, preferably, at least 12 dB.

The latter criterion with respect to the secondary group of harmonics will assure that the timbre of RH-Signal sensed by the listener will have a deep sound quality, as opposed to an irritating "buzz" that would have been sensed if higher harmonics were to have high level of energy.

It should be noted that in the context of the invention "harmonics" encompasses not only pure harmonics (i.e. the Nth pure harmonic of a given fundamental frequency F means a frequency of N*F), but also approximated harmonics (i.e. the Nth approximated harmonic of a given fundamental frequency F means a frequency of N·F·(+5%); thus, by way of non limiting example, 750 Hz, 740 Hz and 760 Hz, are, each, regarded in the context of the invention as the 5th harmonics of the fundamental frequency 150 Hz, where 750 Hz is a pure 5th harmonic and 740 Hz and 760 Hz constitute, each, approximated 5th harmonic.

Turning now to the loudness attribute of the Pseudo-LFPS, it is desired that the RH-Signal and the low frequency sound signal of interest will have the loudness matching attribute. As will be explained "loudness matching"

embraces also a situation where the RH-signal and the low frequency signal will have essentially loudness matching attribute.

It is possible to accomplish the loudness matching attribute by utilizing a loudness matching procedure that employs a loudness analyzer which is capable of measuring loudness levels.

There are well established procedures in the public literature (some of which will be discussed below) for realizing loudness analyzer. This field is being extensively studied and improved methods are constantly being suggested.

In practice, the choice of loudness analysis method should be made according to cost and complexity limitations versus the required sound fidelity, for a specific application.

Accordingly, the present invention provides for a method for conveying to a listener a pseudo low frequency psycoacoustic sensation (Pseudo-LFPS) of a sound signal, comprising:

(i) deriving from the sound signal high frequency signal and low frequency signal (LF signal) that extends over a low frequency range of interest;

(ii) for each fundamental frequency within the low frequency range of interest, generating a residue harmonic signal having a sequence of harmonics;

said sequence of harmonics, generated with respect to each fundamental frequency contains a first group of harmonics that includes at least three consecutive harmonics from among a primary set of harmonics of the fundamental frequency;

(iii) bringing the loudness of said residue harmonic signal to essentially match the loudness of said low frequency signal; and (iv) summing the residue harmonic signal and said high frequency signal so as to obtain psychoacoustic alternative signal.

The present invention further provides for a method for conveying to a listener a pseudo low frequency psycoacoustic sensation (Pseudo-LFPS) of a sound signal, comprising:

(i) deriving from the sound signal high frequency signal and low frequency signal (LF signal) that extends over a low frequency range of interest;

(ii) for each fundamental frequency within the low frequency range of interest, generating a residue harmonic signal having a sequence of harmonics;

said sequence of harmonics, generated with respect to each fundamental frequency contains a first group of harmonics that includes at least three consecutive harmonics from among a primary set of harmonics of the fundamental frequency;

(iii) bringing said low frequency signal and said residue harmonic signal into essentially loudness matching such that $$E_h = E_f RR'(f_f, N) + K$$

where:

$f_f$=fundamental frequency in said LFsignal $E_f$=energy (in dB) of said fundamental frequency in said LFSignal $E_h$=energy (in dB) of RHSignal with respect to $f_f$ RR'(ff,N)=RR(f,N)+−50%, the modified residue expansion ratio between ff and its N'th harmonics, according to the formulas that are described later.

N=Nth harmonics of said fundamental frequency, being the dominant harmonics above fc $f_c$=critical frequency of said LFsignal (iv) summing the residue harmonic signal and said high frequency signal so as to obtain psychoacoustic alternative signal.

As will be shown in the specific description below, the realization of the apparatus is not bound by any specific hardware or software realization. Thus, by way of non limiting example the loudness generator and harmonics generator may be realized as a common hardware module.

There follows a description of a loudness matching procedure according to the invention that obviates the use of conventional loudness analyzer and utilizes instead a downward expander interpretation of the ear's constant loudness curves.

By examining the (well known) constant-loudness curves it can be seen that, for a given frequency in the range of about 20–700 Hz, the ear transfer function from SPL to Phones is similar to that of a 'Downwards Expander', where the expansion ratio is a function of frequency.

Thus, if the SPL at the input is lowered by X dB the loudness at the output is lowered by R*X phones, where R>1, is the frequency-dependent expansion ratio. As specified in the Glossary, the nomenclature 'R(f)' signifies the SPL-to-Phones expansion ratio.

By examining the 'constant-loudness' curves between 20 and 80 phones (which covers more than the practical range of loudness for normal listening conditions), the following observations arise:

At 40 Hz, a range of about 18 dB SPL, is expanded to a range of 60 Phones, i.e. R(40)~3.23. And so on for R(80) ~2.1, and for R(120)~1.74.

Furthermore, it can be seen that within the loudness level range of 20–80 phones, and the frequencies range 20–700 Hz, R(f) is nearly independent of absolute loudness, (or the corresponding SPL).

By way of empirical linear approximation, in the range 20–80 phones and between 20–700 Hz a good approximation to the SPL-to-Phones expansion ratio 'R(f)' as a function of frequency 'f' Hz is provided by:

$$R(f) = \frac{1.0}{(\ln(f) \cdot 0.241 - 0.579)}$$

In general, between 20 and 700 Hz, R(f) is smaller as 'f' is higher. In view of the foregoing, there will now be described how the loudness matching procedure can be implemented in terms of the SPL-to-Phones 'Residue Expansion Ratio.

Thus, when creating a 'Residue Harmonics Signal' a 'Low Frequency Signal' that lies across a low range of frequencies (f1,f2) is acquired. The low frequency signal would subsequently undergo 'SPL-to-Phones expansion' by the ear with ratios between R(f1) . . . R(f2). The 'Residue Harmonics Signal' that is generated therefrom lies across another (higher) frequency band (f3,f4)—that would subsequently undergo 'SPL-to-Phones expansion' with other (lower) ratios R(f3) . . . R(f4).

Thus in order to preserve the loudness-dynamics at the ear (in phones), the 'Residue Harmonics Signal' dynamic range in terms of SPL should be expanded relative to that of the 'Low Frequency Signal'. The expansion ratio here should be somewhere between R(f1)/R(f3) and R(f2)/R(f4). This 'additional' expansion ratio—by which the 'Residue Harmonics Signal' should be expanded relative to the 'Low Frequency Signal' is designated the 'Residue Expansion Ratio'. A more detailed explanation by way of an example follows:

For a better understanding, consider a non-limiting example of creating a 'Psychoacoustic Alternative Signal' with frequencies above 120 Hz (hereinafter "critical frequency"), to replace a low frequency signal in the range 40–120 Hz.

For any fundamental frequency between 40–120 Hz, the Residue Harmonics Signal contains its first 3 harmonics with frequencies above 120 Hz.

In this example, for frequencies between 60 and 120 Hz the 2'nd to 4'th harmonics satisfy the conditions. And for frequencies between 40 Hz and 60 Hz 3'rd to 5'th harmonics satisfy the conditions.

The resulting 'Residue Expansion Ratio', between the fundamental, and it's first relevant harmonic being:

As noted above:

$$RR(f, n) = \frac{F(f)}{R(n \cdot f)}$$

Substituting the explicit expression for R(f) results in:

$$RR(f, n) = \frac{\ln(n \cdot f) \cdot 0.241 - 0.579}{\ln(f) \cdot 0.241 - 0.579} =$$

$$RR(f, n) = \frac{\ln(n) \cdot 0.241 + \ln(f) \cdot 0.241 - 0.579}{\ln(f) \cdot 0.241 - 0.579} =$$

$$RR(f, n) = 1 + \ln(n) \cdot 0.241 \cdot R(f)$$

TABLE 1

| Fundamental $f_f$ | $R(f_f)$ | h = No. of 1'st Harmonic >120 Hz | n · $f_f$ = Frq of 1'st Harmonic >120 Hz | R(n · $f_r$) | $RR(f_f, n) = \frac{R(f_f)}{R(n \cdot f_f)}$, Residue exp ratio |
|---|---|---|---|---|---|
| 40 Hz | R(40) = 3.23 | n = 3'rd | 120 Hz | R(120) = 1.74 | 1.85 |
| 50 Hz | R(50) = 2.75 | n = 3'rd | 150 Hz | R(150) = 1.59 | 1.73 |
| 60 Hz | R(60) = 2.45 | n = 2'nd | 120 Hz | R(120) = 1.74 | 1.41 |
| 70 Hz | R(70) = 2.25 | n = 2'nd | 140 Hz | R(140) = 1.63 | 1.38 |
| 80 Hz | R(80) = 2.1 | n = 2'nd | 160 Hz | R(160) = 1.55 | 1.35 |
| 90 Hz | R(90) = 1.98 | n = 2'nd | 180 Hz | R(180) = 1.49 | 1.33 |
| 100 Hz | R(100) = 1.88 | n = 2'nd | 200 Hz | R(200) = 1.43 | 1.31 |
| 110 Hz | R(110) = 1.81 | n = 2'nd | 220 Hz | R(220) = 1.39 | 1.30 |

The resulting RR(f,n) was calculated by dividing R($f_f$) by R(n·$f_f$). It can be seen that for all cases where the first dominant Harmonic is the 2'nd harmonic, the 'Residue Expansion Ratio' is closely approximated by a constant of about 1.34 (regardless of the specific fundamental frequency). For cases where the first dominant Residue Harmonic is the 3'rd harmonic, it is closely approximated by the constant of about 1.74.

A straight forward outcome of this result is that in case where the dominant harmonic in the 'Residue Harmonics Signal' is the 2'nd harmonic, and the frequencies of both signals lies between 20 and 700 Hz, then in order to achieve Loudness Matching' it is sufficient that the dynamics of the Residue Harmonics Signal—as a whole signal—be expanded by a constant ratio of about 1.34 relative to that of the low frequency signal. Thus, the Residue Harmonics Signal of the sound signal (in either digital or analog form) is treated so as to affect the SPL dynamics thereof which, in turn, will bring about the desired loudness dynamics. It should be noted that the present invention does not seek to cope with any inherent imperfections that are associated with transforming electrical energy to acoustic energy in frequency range essentially above critical frequency, i.e. where the fidelity of the electro-acoustic transducer is acceptable.

The same result is straight forward if the dominant harmonic in the 'Residue Harmonics Signal' is the 3'rd harmonic, where the approximated constant ratio is 1.74. The latter observations may be generalized according to the following algorithmic expression:

First the expression for the residue expansion ratio RR(f, n) is resolved between a fundamental frequency and its n'th harmonics (where both lie in the range 20–700 Hz):

This result suggests that the residue expansion ratio depends both on the fundamental frequency and the number of harmonics.

A further simplification can be achieved by approximating the value of RR(f,n) over a range of frequencies. Thus, by empirically examining the above formula for RR(f,n) it can be seen that, by way of a non limiting example, for a given harmonic number n<6, and up to an error of about 10%, the residue expansion ratio across a frequency range of one octave (fr . . . 2·fr) can be approximated by a single value—that is RR√2·fr,n, note that √2·fr is the center frequency of an octave on a logarithmic scale; thus RR(f,n)=RR(√2·fr,n)±10% where: RR(√2·fr,n)– approximated residue expansion ratio between the fundamental and n'th harmonics when fundamental is ±½ octave of fr, and both the fundamental and harmonics fall in the range 20–700 Hz.

f—a fundamental frequency such that fr<f<2·fr n—the harmonics number, n<6.

In the practical example where fc=120, and n<6, fr can be as low as 24 Hz, to satisfy n·fr≧fc, so that this approximation can be very useful in practical cases.

Similarly a variety of frequency ranges and corresponding harmonics numbers limits can be derived, to meet a desired degree of approximation via a single RR value per frequency range and a choice of n.

A further useful result that will be explained in detail in connection with the circuit of FIG. 4, is, that for a single set of parameters, the circuit of FIG. 4 approximates the residue expansion ratio RR(f,n) to within 10% for n<4, and thus can serve to pseudo extend the frequency response down to fc/3.

Using a residue expansion ratio as calculated by the formula RR(f,n) hereinafter "natural residue expansion ratio" will bring about the desired loudness matching that results in PA signal that complies with the pseudo LFPS. However, in many practical cases, as will be explained in the general case, there are reasons to use ratios in a range of ±50% around the calculated RR(f,n). The term RR'(f,n) is designated hereinafter the "modified residue expansion ratio" and thereby obtains essentially loudness matching.

$$RR'(f,n)=RR(f,n)\pm 50\%$$

Note that after treating the Residue Harmonic Signal, the following equations apply:

$$E_h=RR(ff,n)\cdot Ef+K$$

where:

$f_f$=the fundamental frequency from the LFSignal $E_f$=the energy (in dB) of ff in the LFSignal $E_h$=the energy (in dB) of the RHSignal in respect to $f_f$ RR(ff,n)=Residue Expansion Ratio K=constant gain in dB.

On the basis of the foregoing discussion, a different approach for the implementation of a PASignal generator is offered as will be illustrated, e.g. in the circuitry of FIG. 4.

Using the "residue expansion ratio" approach and the suggested approximations leads to the following advantages:

It shows that very few bands (e.g. 2 in the example of pseudo extending the frequency response down to fc/3) needs to be analyzed, and a simple relation between the fundamental band and its harmonics, i.e. a constant residue expansion ratio, should be attained, thus avoiding a detailed frequency/energy analysis of the LFSignal and RHSignal.

The formula for RR(f,n) serve as a design criteria for frequency bands of the analysis, in order to meet a desired degree of approximation.

Having described the underlying concept of the invention the main advantages of using the proposed technique of the invention will now be elaborated:

Owing to the use of the technique of the invention, the conveyance to the listener of pseudo low frequency psycoacoustic sensation can be significantly enhanced even under the following prevailing constraints with which prior art solutions are unable or only partially cope with, i.e.:

Reproduction trough a small-size electro-acoustic transducer;

Limited power consumption; and/or

Low-cost electro-acoustic transducers.

Some non limiting examples of such devices are:

Desk-top MultiMedia speakers—where both physical size and competitive pricing pose constraints.

Portable Lap-top MultiMedia computers—where size and power consumption pose constraints.

Ear-Phones—where size and cost pose constraints.

Even high quality speaker systems can benefit from circumventing their low efficiency at the very low frequency range, by utilizing the technique of the invention.

The proposed technique of the invention has the advantage that it can be used to treat the sound signal at one or more of the following stages: audio production and broadcasting reproduction processes. Thus, the sound signal may be treated as part of the audio production process, for individual audio tracks or the final audio mix. Alternatively, or in addition, the sound signal may be treated as part of the broadcasting stage (including but not limited to broadcasting over Radio Frequencies, cable networks, and the Internet), or as part of the reproduction stage at the consumer's place, e.g. as part of the audio player, amplifier, or electro-acoustic transducers.

Furthermore, because (optionally) the original fundamental frequency (that resides in the low frequency range of interest) can be completely removed, then there is no harm in applying the proposed technique several times in cascade. This feature of the process serves as an inherent compatibility in cases where the technique is applied consecutively at different stages between the preparatory and reproduction stages of the audio signal.

This enables, on the one hand, for audio content producers, or broadcasters, to supply audio signal whose sound quality at low-frequencies is less dependent of the specific electro-acoustic system used to reproduce it, as well as the absolute reproduction level, and on the other hand for better price/performance trade-offs for audio reproduction systems.

For example, various types of low cost MM speakers which exhibit tolerated efficiency for frequencies that exceed 120 Hz, can, due to the proposed technique have a pseudo-extended frequency response down to as low as 40 Hz.

Depending on the particular application, full or attenuated intensity of the low frequency signal of interest may also be summed to the psychoacoustic alternative signal.

In some cases the presence of the low frequency signal of interest may improve the resulting pseudo extension.

One, non limiting, consideration for deciding whether and to what extent to include the low frequency signal of interest depends on the electro-acoustic transducer's efficiency.

Thus, preferably (although not necessarily), if the electro-acoustic transducer under consideration exhibits a very low efficiency in a given range of the bass frequency range, then the low frequency signal of interest that fall in said given range should preferably be filtered out in order to avoid undue load of the electro-acoustic transducer.

If, on the other hand, the electro-acoustic transducer under consideration exhibits, in a given range of the bass frequency range, an efficiency which approaches its average efficiency, then preferably (but not necessarily) full or attenuated intensity of the low frequency signal of interest are summed to the psychoacoustic alternative signal.

Similar considerations should be taken into account also with respect to those harmonics of fundamental frequencies which, by themselves, reside in that frequency range of the electro-acoustic transducer which exhibit low efficiency.

BRIEF DESCRIPTION OF THE DRAWINGS

For a better understanding, the invention will now be described, by way of example only, with reference to the accompanying drawings, in which.

DESCRIPTION OF SPECIFIC EMBODIMENTS

Figure 3A:
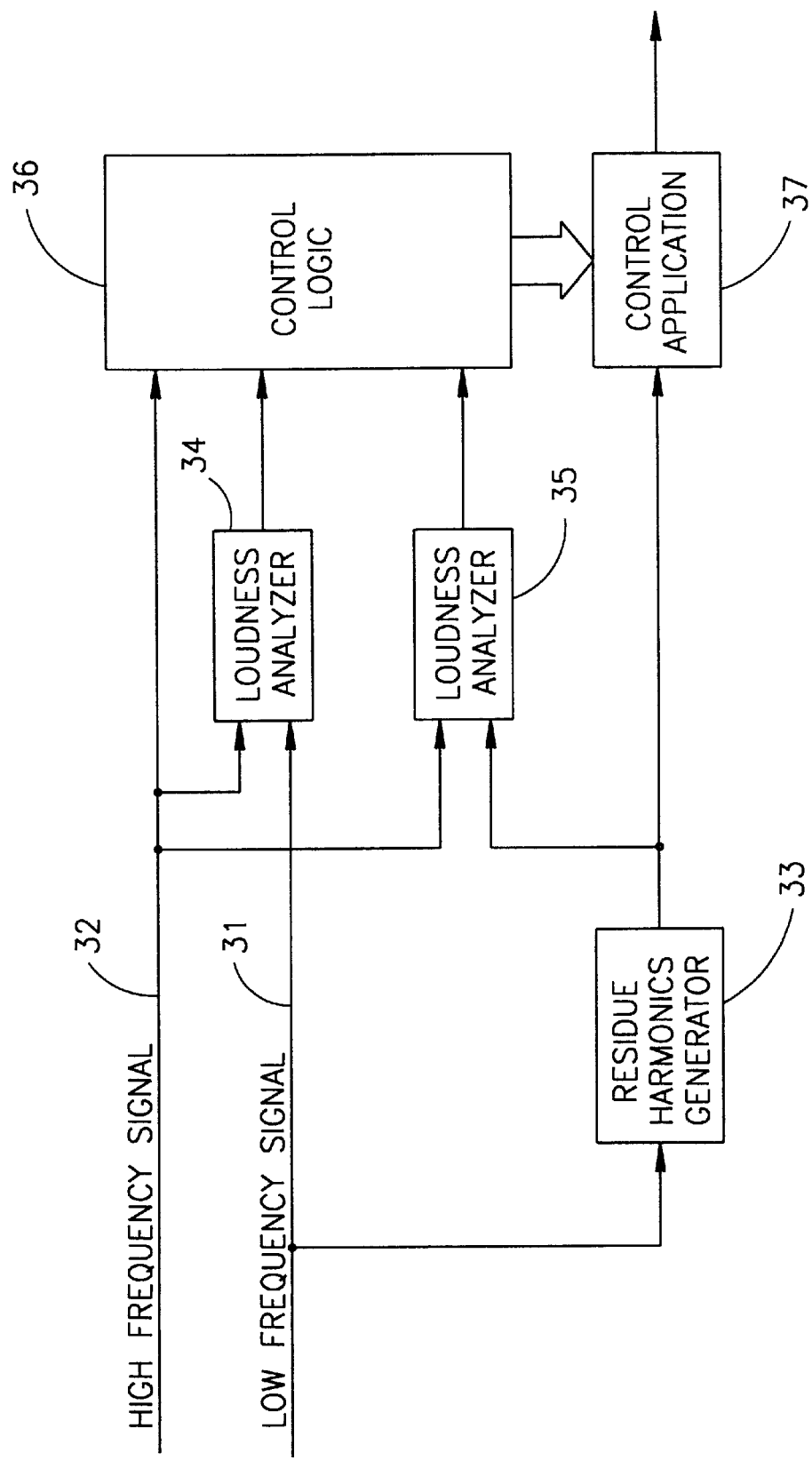
FIG. 3a is a schematic block diagram illustrating a Psychoacoustic Alternative Signal Generator according to one embodiment of the invention.

Attention is now directed to FIG. 3a showing a schematic block diagram illustrating a dynamic matching procedure utilizing loudness analyzer.

Thus, the input signal is divided into, preferably, non-overlapping Low Pass (31) and High Pass (32) ranges, by utilizing known per se filtering technique, as described e.g. in Alan V. Oppenheim/Ronald W. Schafter, Digital Signal Processing (Chapter 5).

From the input 'Low Frequency signal' the 'Residue Harmonics Signal' according to the Residue Pitch effect is generated (33), i.e. at least three consecutive harmonics from among the first group of harmonics. If desired, harmonics from the second group may also be included, however, as specified before, the energy thereof is significantly lower than that of the first group harmonics. There are known in the art various techniques for generating harmonics. Typical non exclusive techniques being full or half wave rectification, hard/soft clipping, non linear gain curve, tacking the square (or higher order polynoms) of the signal, and other non-linear operations on the signal. Rectification and clipping create harmonics up to a high order, and are harder to control precisely.

Figure 6:
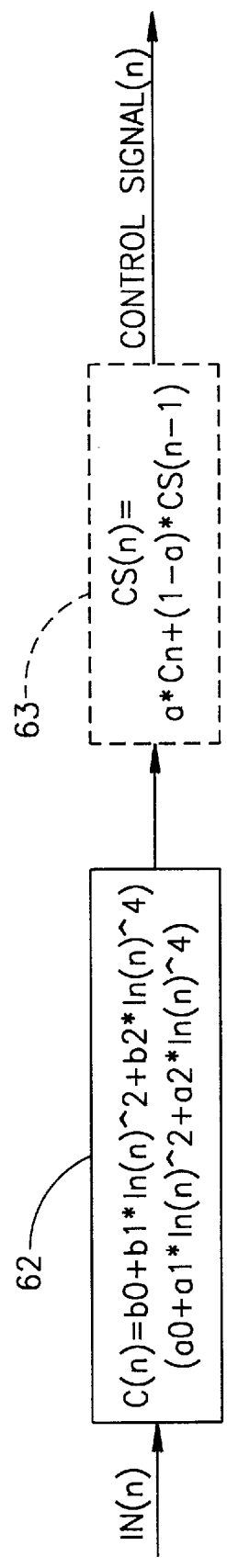
FIG. 6 is another possible realization of a compressor logic that is employed in the embodiment of FIG. 4.

Reverting now to FIG. 6, the loudness of the input 'Low Frequency signal' as well as the 'Residue Harmonics Signal' (34 and 35, respectively) are analyzed—note that for precise loudness analysis, knowledge of the entire audio signal presented to the ear's is needed, thus in general knowledge of the 'High Frequency Signal' is also needed in the 'Loudness Analyzer'.

To this end known 'loudness meter' may be utilized. the latter simply measures the energy of the 'frequency weighted signal'. Much more sophisticated ways are proposed that improve the precision of this estimation, by taking into account also masking effects, and 'critical bands' frequency analysis.

Whereas 'loudness meter' approach for loudness analysis are very simple to implement, other approaches, whilst being applicable, are very complex to implement. Such complex methods involve 1. Dividing the audio signal into frequency bands that matches the ear's critical bands.
2. Measuring the energy in each band, as a function of time.
3. Deriving the (time dependent) masking threshold for each frequency band, as the superposition of masking curves imposed on it by the energy in the rest of the bands.
4. Computing the (time dependent) loudness of each frequency band as the amount of energy in it that lies above said masking threshold, weighted by the ear's sensitivity in that frequency band, at that energy level.
5. Summing the (time dependent) loudness of all bands in a certain frequency region (or all the bands) as computed in 4. will give the loudness in that frequency region (or the overall loudness). Of course other loudness analyzing techniques may be employed.

Turning back to FIG. 3a, a control logic (36) is applied to the 'Residue Harmonics Signal' that will match it's loudness to that of the input 'Low Frequency signal'—note that for precise control logic, knowledge of the entire audio signal presented to the ear's is needed, thus the 'High Frequency Signal' is also needed here.

Given that the 'Loudness Analyzer' is indeed precise, and taking into account the dynamic variations of loudness level, the conceptual block diagram of FIG. 3a can implement the 'Loudness Matching' desired for the 'Psychoacoustic alternative signal'. A detailed description of the various modules depicted in FIG. 3a, is given below with reference also to FIG. 3b.

Figure 1A:
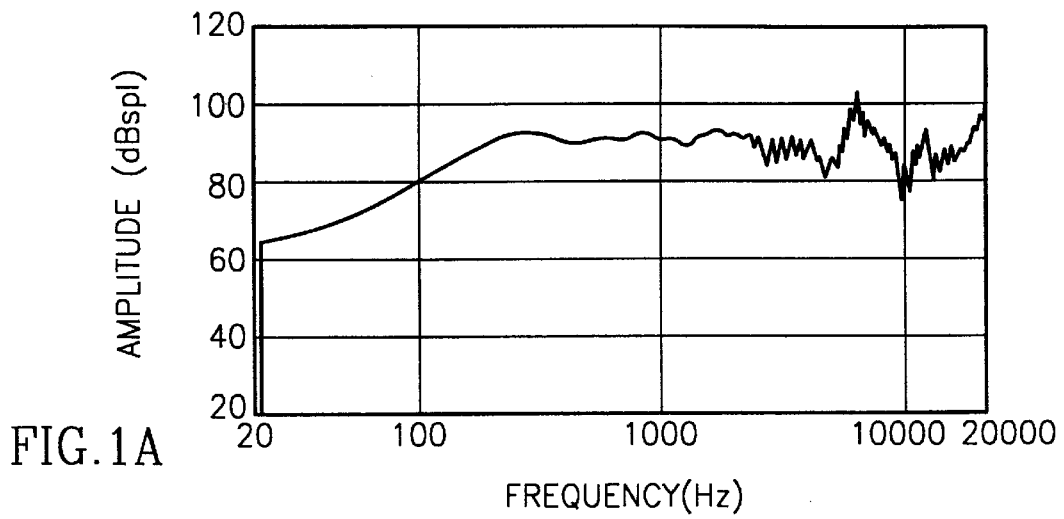
FIG. 1 show eight frequency response curves of respective eight good quality commercially available MM speakers.
Figure 1B:
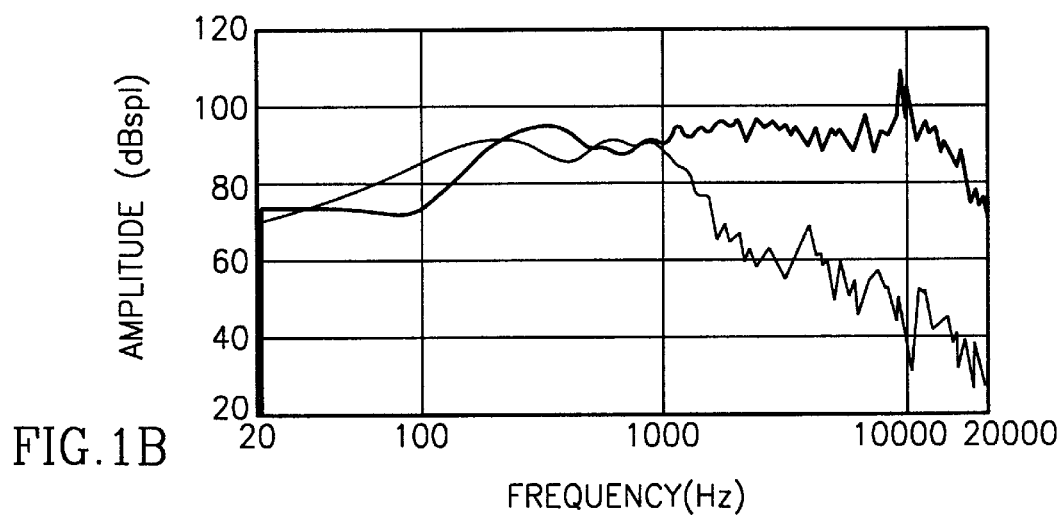
Figure 1C:
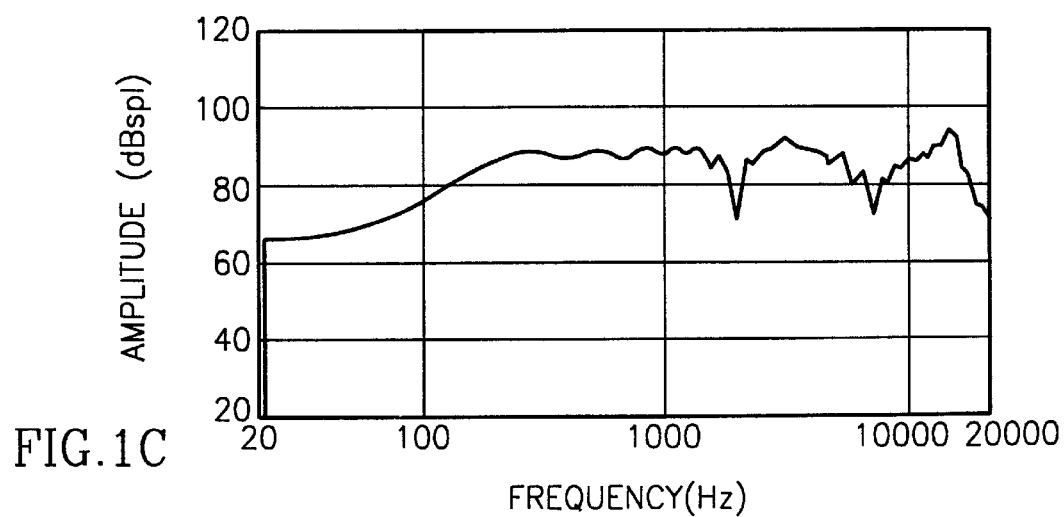
Figure 1D:
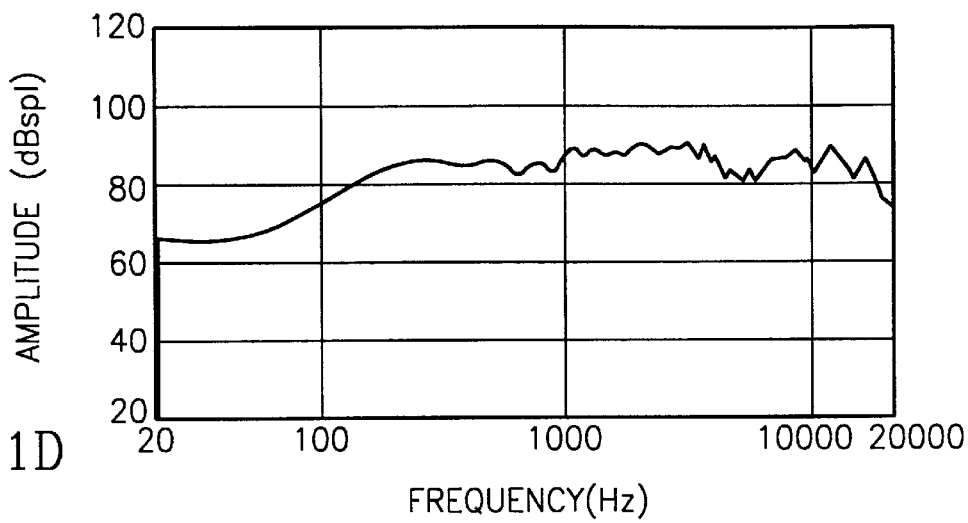
Figure 1E:
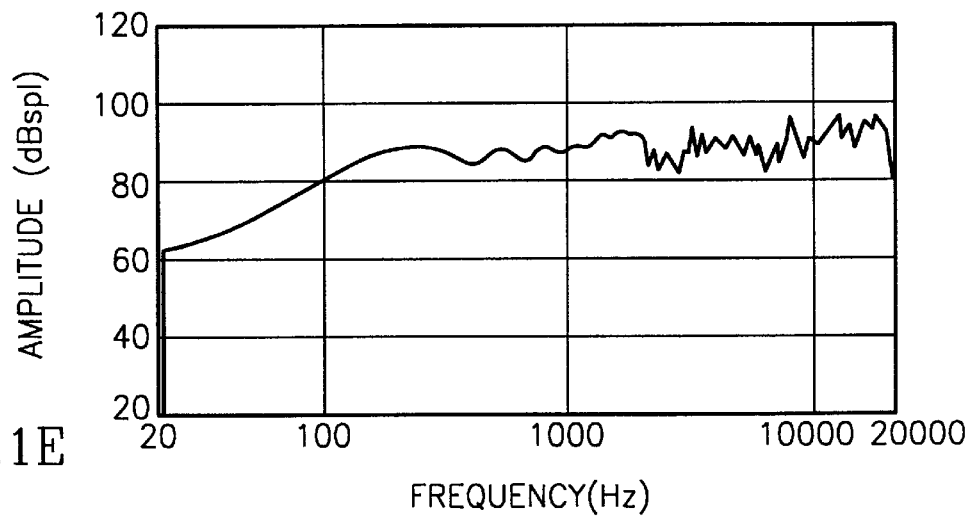
Figure 1F:
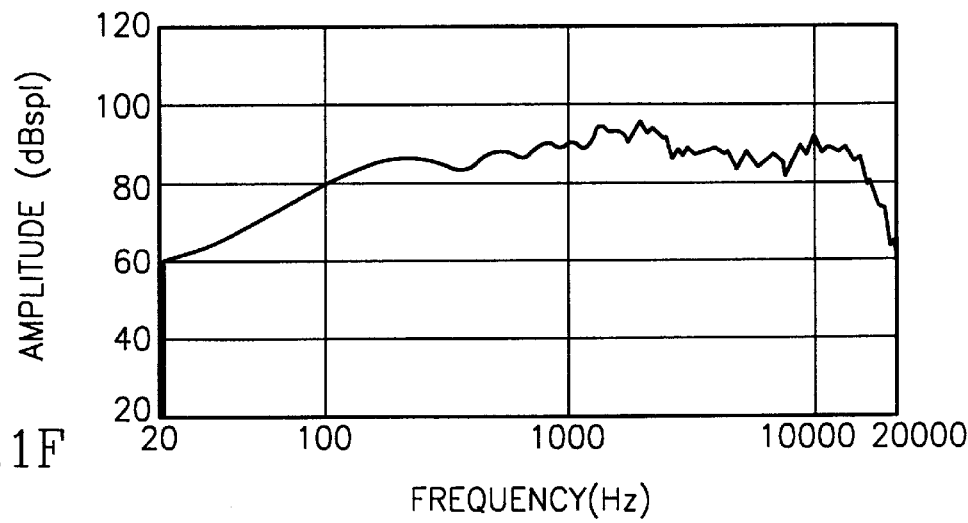
Figure 1G:
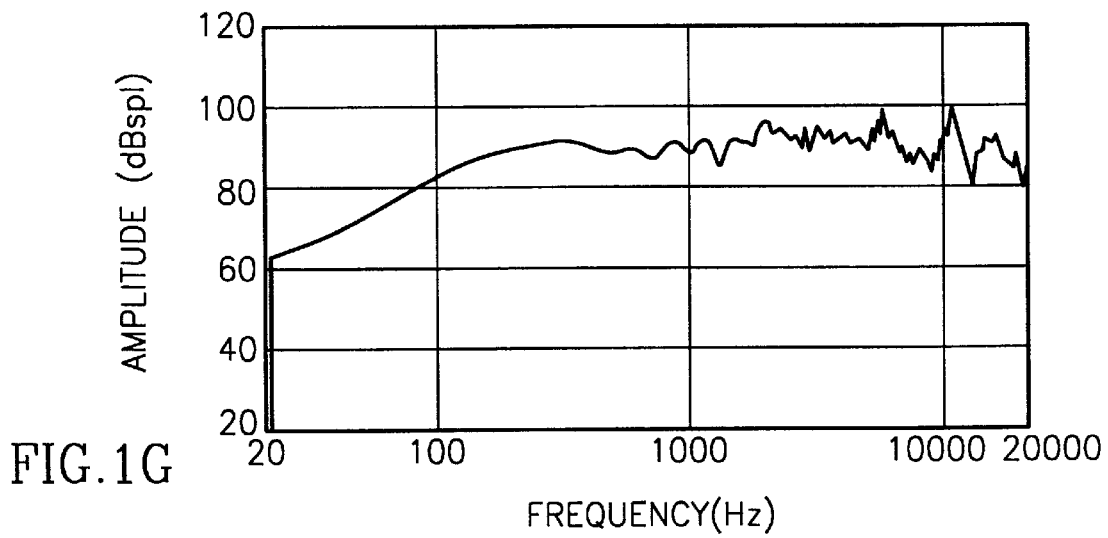
Figure 1H:
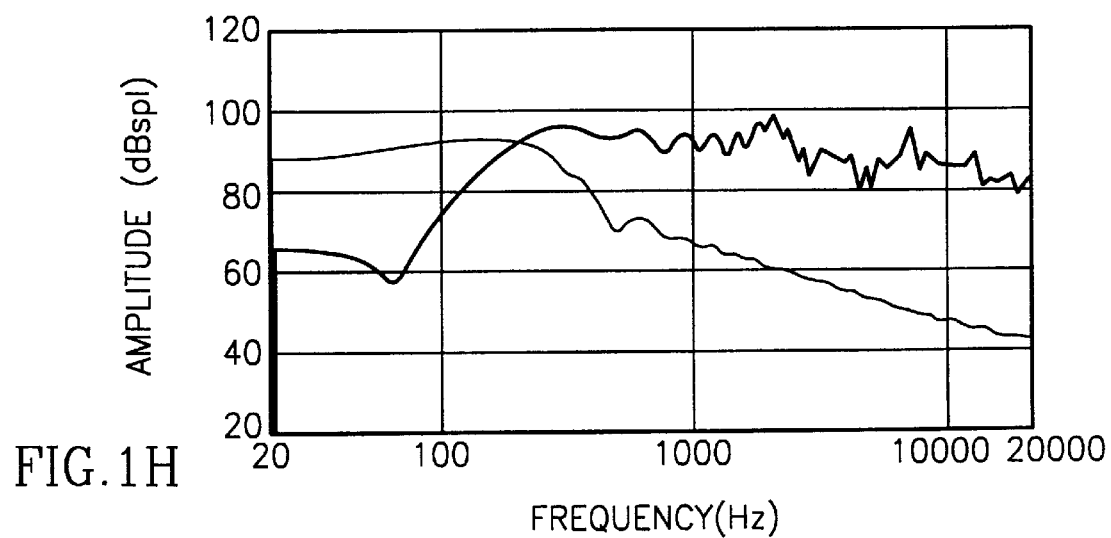
Figure 2:
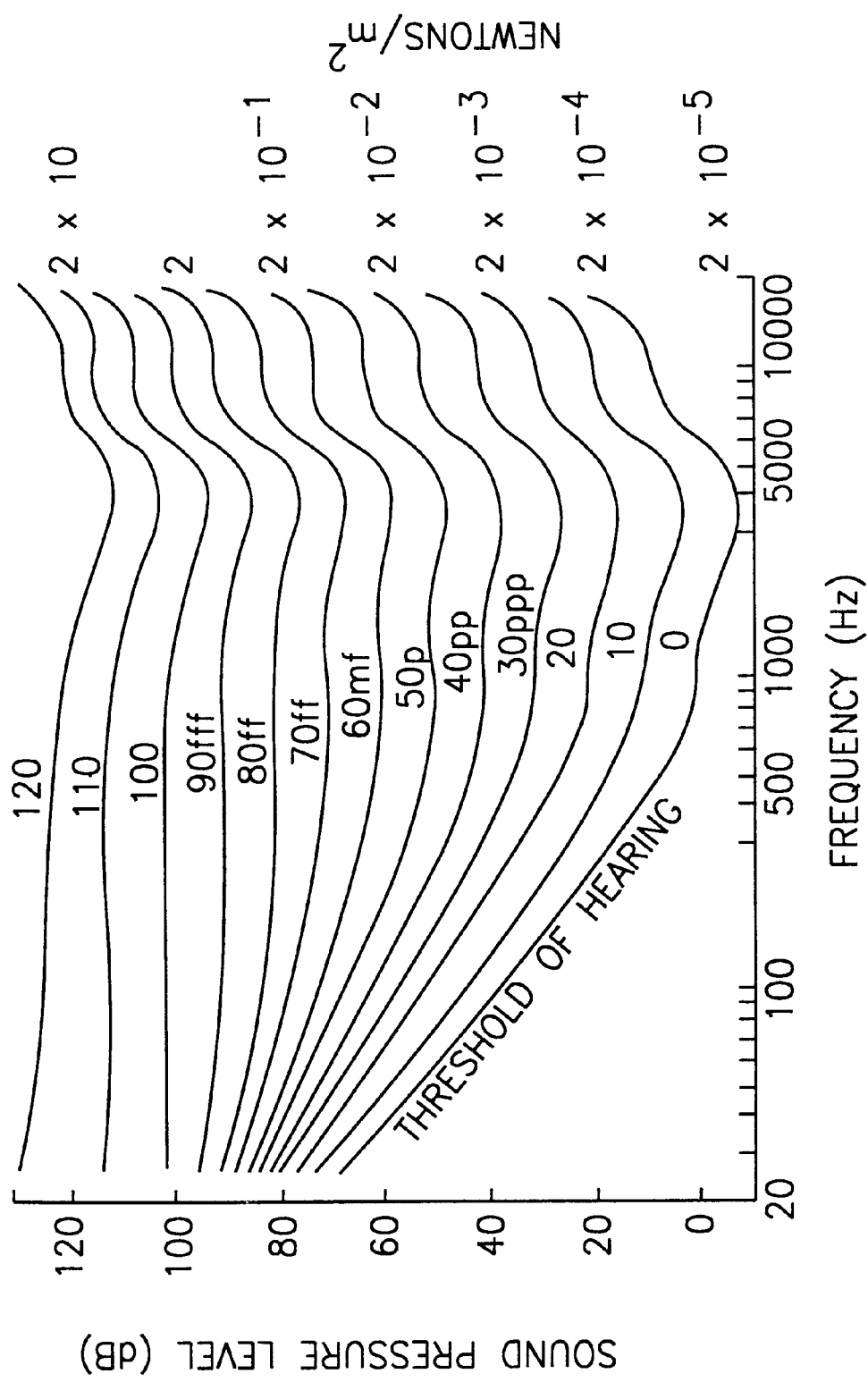
FIG. 2 is a graph representation of equal loudness contours.

The goal of this circuitry is to match the loudness of the LFSignal to that of the PASignal. To this end, after having created the RHSignal (that is not yet loudness-matching to the LFSignal) the following steps are executed:

(a) splitting the LFSignal to frequency bands 301 so as obtain corresponding N+1 signals designated $LF_0$–$LF_N$, and detecting the energy of each signal in energy detection modules $302_0$ to $302_N$, respectively;

(b) splitting the RHSignal to frequency bands 303 so as obtain corresponding M+1 signals designated $RH_0$–$RH_M$, and detecting the energy of each signal in energy detection modules $304_0$ to $304_M$, respectively;

(c) for each frequency band of the RHSignal analysis as obtained from modules $304_0$ to $304_M$, determining in respective modules $305_0$–$305_M$ the fundamental frequency band (out of modules $302_0$ to $302_N$) which harmonics are responsible for most of the energy in this band. The pertinent logic in this process depends also on how the RHSignal is generated. Thus, for example, if RHSignal contains only 2'nd and 3'rd harmonics, then the energy for each of the RHSignal bands must have resulted from a fundamental band of frequencies either ½ or ⅓ times lower the band's frequency. In this case there is possibility for ambiguity on some of the RHSignal bands that are both a 2'nd harmonics of one LFSignal band, and a 3'rd harmonics of another. In such a case, the fundamental band that contains most energy is selected;

(d) having determined the correspondence between modules $304_0$ to $304_M$ and $302_0$ to $302_N$, modules $306_0$ to $306_M$ are adapted to compute the gain needed to match the loudness between corresponding modules according to the ear's sensitivity curves. In other words, identify in the graph of FIG. 2 the loudness associated with the fundamental frequency band (i.e. from $302_0$ to $302_N$) according to the frequency (abscissa) and the SPL energy (ordinate); determine in modules $306_0$ to $306_M$ the SPL energy that is required to create the same loudness at the corresponding module $304_0$ to $304_M$; and determine the gain that is required to bring the energies of $304_0$ to $304_M$ to said required SPL energy;

(e) applying the gain difference in respective multipliers $307_0$ to $307_M$ so as to obtain M loudness matched signals; and (f) summing the M loudness matched signals so as to obtain the PA signal.

Figure 3B:
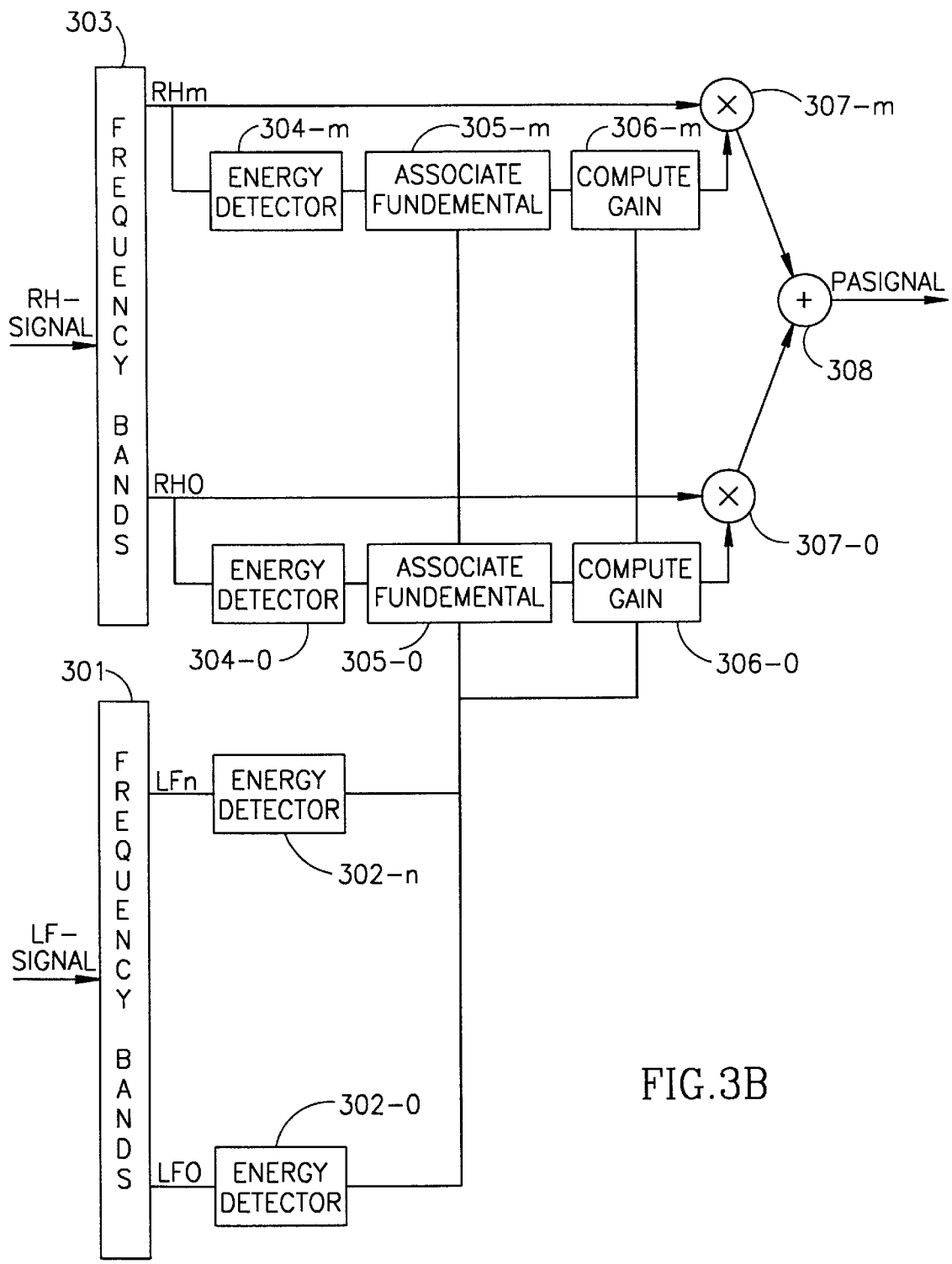
FIG. 3b is a block diagram of loudness analyzer, control logic and control application modules that form part of the generator illustrated in FIG. 3, according to one embodiment of the invention.
Figure 3C:
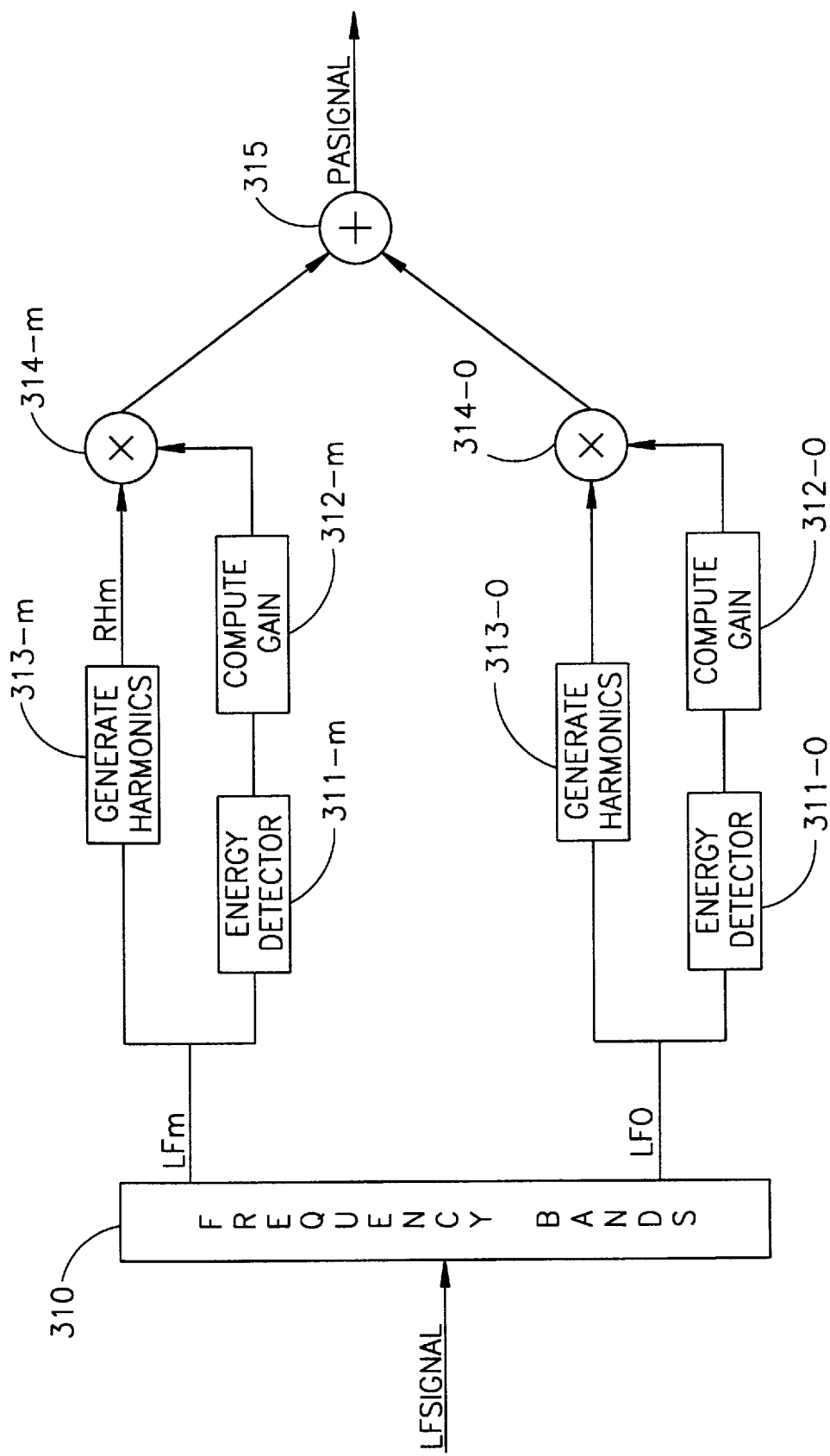
FIG. 3c is a block diagram of a PASignal generator, according to another embodiment of the invention.

Another variant of PASignal generator is shown in FIG. 3c. This circuitry implements the RHSignal generation and loudness matching within each frequency band. This example also makes use of the results obtained for the approximated residue expansion ratio RR(f,n) for a band of frequencies. To this end, after separating the LFSignal from the whole input signal, the following steps are executed:

(a) splitting the LFSignal to frequency bands 310 so as to obtain M+1 signals designated $LF_0$ to $LF_M$;

(b) generate M+1 RHSignals $RH_0$–$RH_M$ with respect to $LF_0$–$LF_M$ in the corresponding modules $310_0$ to $313_M$. Note that since the harmonics generation method is known in advance, the energy relations between the signals $LF_0$–$LF_M$ and $RH_0$–$RH_M$ respectively, are in general known;

(c) detect the energy of each of the $LF_0$–$LFm$ signals $311_0$–$311_M$ (alternatively the detection could have been done on the $RH_0$–$RH_M$ signals);

(d) compute the respective gains to be applied to the $RH_0$–$RH_M$ signals $312_0$–$312_M$. This computation is based on the a priori knowledge on the respective relations between the $LF_0$–$LF_M$ and $RH_0$–$RH_M$ signals energies, and the approximated residue expansion ratio, RR(f,n), for each respective band. The gain should be computed such that the end result is matching the energies of the $RH_0$–$RH_M$ signals to the currently detected energies of the corresponding $LF_0$–$LF_M$ signals through the corresponding residue expansion ratios for each band;

(e) applying the gain in respective multipliers $313_0$–$314_M$ so as to obtain M loudness matched signals $RH_0$–$RH_M$;

(f) summing the m loudness matched signals $FH_0$–$RH_M$ so as to obtain the PA signal.

Figure 4:
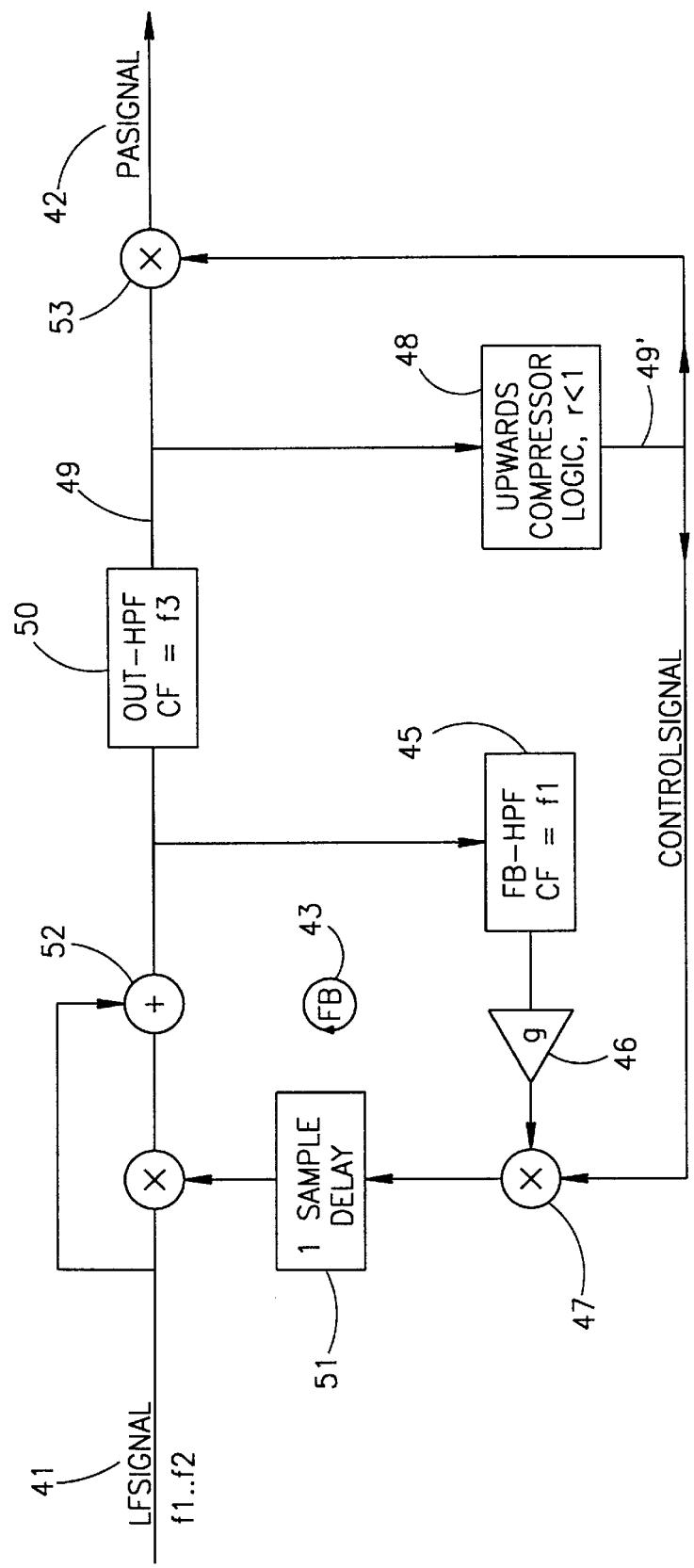
FIG. 4 is a schematic block diagram illustrating a Psychoacoustic Alternative Signal Generator according to another embodiment of the invention.

FIG. 4 illustrates a schematic block diagram illustrating a Psychoacoustic Alternative Signal Generator in accordance with another embodiment of the invention. FIG. 4 is simplified as compared to conventional hitherto loudness analyzer. The reason is that it combines the harmonics generation process and the loudness matching into one simple recursive circuit, that consists of elementary components such as filters, adders, multipliers, upwards compressor.

Due to derivation of approximated residue expansion ratio that apply to whole frequency ranges and their n'th harmonics (e.g. the approximated residue expansion ratio for a band of frequencies), and further because the suggested circuit recursively generate the harmonics while matching their loudness, there is no need for complex energy/frequency analysis. In fact, as will be shown, a single upwards compression ratio, and a few simple filters, provides a good approximation (to within less than ±10%) for loudness matching in cases where either the 2'nd, 3'rd or 4'th harmonics are the dominant ones.

As is well known to those versed in the art, the digital circuit described herein is only one out of many possible varieties (analog, digital or combination thereof) for accomplishing the same result.

The circuit of FIG. 4 receives as an input the low frequency signal of interest—LFSignal (41) and generates a Psychoacoustic Alternative Signal—PASignal (42).

The LFSignal extends over a range of low frequencies f1 ... f2 and the PASignal extends above another frequency f3. Typically, but not necessarily f3=f2. For many applications f3 falls in the range f1<f3<f2 is also applicable.

For a specific example of enhancing a cheap speaker, that is inefficient bellow 120 Hz, the specified frequencies are set to f1=40 Hz, f2=120 Hz, f3=120 Hz. Thus, by this specific example, the LFSignal that resides predominantly between 40–120 Hz is replaced by a PASignal that lies mostly about 120 Hz.

A General Explanation of the Circuit

As explained before the PASignal should be a RHSignal, containing harmonics of the frequencies in the LFSignal, and should comply with the Loudness Matching attributed with respect to the LFSignal.

As will be shown, this circuit integrates both the processes of harmonics generation and Loudness Matching as a one non-linear recursive process.

The non-linear recursive process comes to effect as a 'FeedBack loop' (43) in the circuit of FIG. 4.

Generally speaking, the signal in the FBLoop is recursively multiplied by the input (44), thus generating higher harmonics at each pass trough the loop. The Feed Back gain of the loop is constructed of three components:

A Frequency-Dependent gain is applied by the FB-HighPassFilter (45).

A Constant (<1) gain is applied at the attenuator (46) following the filter.

A dynamic gain (47), controlled by the 'Compressor Control Logic' (48). This dynamic gain depends on the energy-envelope of the generator's final output signal as sensor at location (49).

Finally an Output-HighPass Filter (50) controls what frequencies are allowed at the output of the generator. In our specific example this would be frequencies >120 Hz.

Detailed Description of the Recursive FBLoop: (Going 'Clockwise' from the Input)

Multiplier (44)—where the LFSignal (41) (containing fundamental frequencies) is multiplied by the (delayed) (51) Feed Back Signal. Thus generating the (N+1)'th order harmonics from any N'th harmonic in the Feed Back Signal before the multiplication.

Note that this multiplication also have the effect of inherent expanding the dynamic range associated with each harmonic. As will be explained later, this expansion is compensated in gain (47) in order to bring about the desired residue expansion ratio.

Another side effect of the multiplication (44) is the generation of 'intermodulation' and DC components. As will be explained later, such components that fall bellow the frequency f1, are attenuated by the filter FB-HPF (45).

Mixer (adder) (52)—aims at injecting the LFSignal into the FB and maintaining the fundamental frequencies in the FBLoop at sufficient intensity for successively generating higher harmonics recursively in the following 'circulations' trough the FBLoop. From after this adder the output of the FBLoop is taken to the rest of the circuit.

Figure 7:
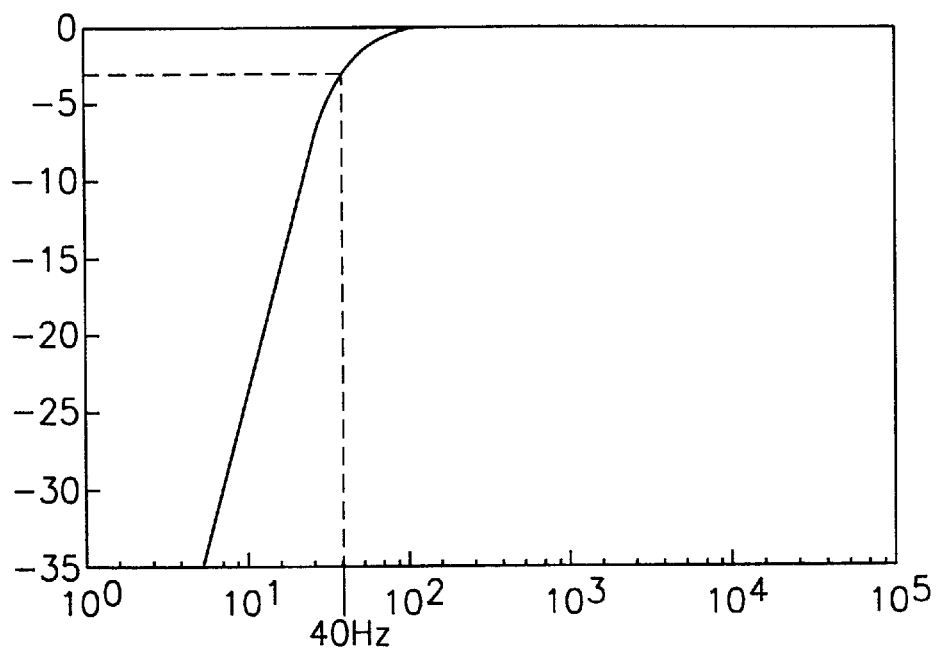
FIG. 7 shows a frequency response graph of one possible FB-HighPass Filter that is employed in the embodiment of FIG. 4.

High Pass Filter (45)—FB-HPF with Cutoff frequency= f1. This filter implements the 'frequency-dependent' part of the FeedBack gain, preventing frequencies bellow f1 (and the DC component) from developing. In the specific example under consideration, it was found that a filter with slope 12 dB/Oct (such as a 2'nd order Butteworth) provides satisfactory results. FIG. 7. shows this filter graphically.

Gain (46)—controls the rate of attenuating high harmonics and in particular those belonging to the secondary group.

Gain (47)—is fed with Control Signal from the compressor (48). This multiplier implements the 'dynamic' part of the FeedBack gain. It is at this point where we actually control the dynamic range associated with each harmonic. In other words it gives rise to the desired residue expansion ratio. As was explained before, it is desired that each harmonic will be downwards-expanded relative to it's fundamental by the 'Residue Expansion Ratio'. The effect of the Multiplier (44), in general, result in an exaggerated downwards-expansion ratio per harmonic—this is being compensated for by gain (47), by applying upwards-compression. Since the feedback circuitry (43) is realized as a recursive process, the derivation of the proper upwards-compressor ratio that is applied to the control signal the gain (47) is not trivial, and will be explained bellow.

Note that the Control Signal undergoes, known per se smoothing such that it affects mainly the energy-envelope, or dynamic range, of the FBLoop signal, and it's effect on the frequency content is negligible.

1-sample-delay (51)—required for the digital-domain implementation, since a Feed-Back loop in the digital domain must have at least one sample delay. It would not be needed in an analog domain implementation. Note that the frequencies of the LFSignal are significantly lower than the sampling rate, the effect of this one sample delay can be neglected. For example for the standard sampling rate of 44100 Hz, and f2=120 Hz, 44100/120=367.5.

Figure 8:
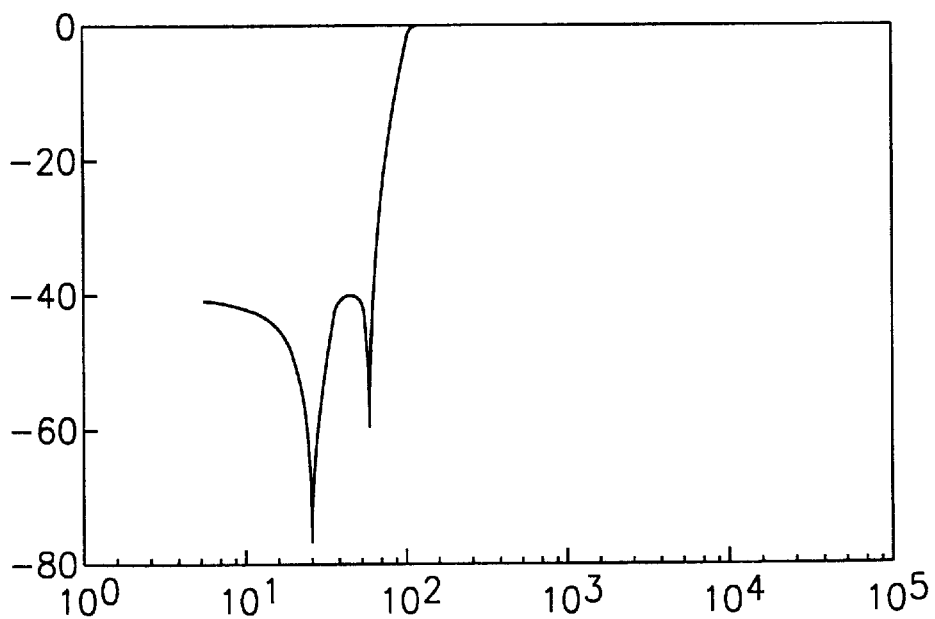
FIG. 8 shows a frequency response graph of one possible Out-HighPass Filter employed in a block diagram depicted in FIG. 4.

Having described the components of the FB portion (43), the remaining components of the circuit will now be described:

Output-HighPass filter (50)—the output from the FBLoop, after having been subject to adder (52), is fed in to the Output-HighPass filter. This filter rejects frequency components that are bellow f3 (in this specific example 120 Hz), and feeds both the Upwards-Compressor Logic, and the output Multiplier (53). As will be explained bellow, the effect of this filter is very important for the proper function of the Upwards-Compressor Logic, but also—in this specific example—serves to avoid un-necessary load of the following speaker. By this particular example, a 4'th order elliptic filter, with −40 dB stop band ripple was found satisfactory. FIG. 8. shows this filter graphically.

Multiplier (53)—Here the Control Signal from the compressor is applied to the generator's output.

Upwards Compressor (48)—This circuit computes a ControlSignal (49') that if applied (by way of a multiplier) to its input, will result in compressing the energy-envelope dynamic range, (in terms of dB) of the input signal by a ratio 'r' where typically r<1.0. Note that the control signal is applied both to the Feed Back gain, and to the generator's final output. The input to the upwards compressor is fed from HPF (50), so that the envelope of the RHSignal above f3 is measured, not including lower frequencies that exists inside the FBLoop signal.

In principle the Control Signal is:

$$C(t) = \frac{(E(t)^r)}{E(t)^{(r-1)}}$$

Where E(t) is the (time varying) energy-envelope of the input signal.

Such that the signal C(t)·Input has an envelope $E(t)^r$.

There are various ways for implementing a compressor in the Digital or Analog domains, that are in general a known technique for those skilled in the art.

Figure 5:
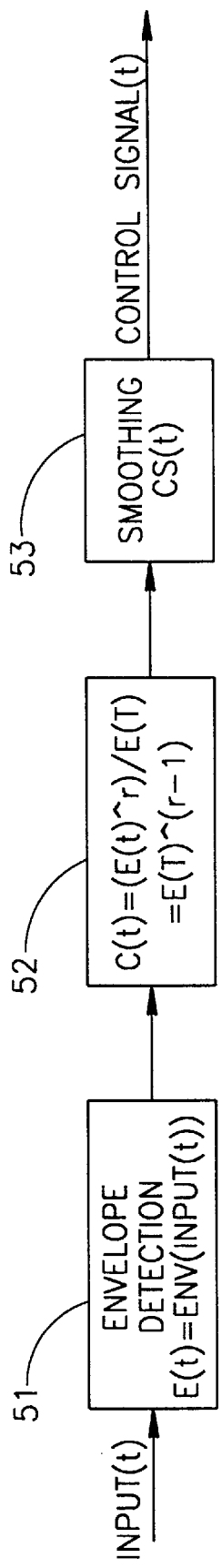
FIG. 5 is one possible realization of an upward compressor logic that is employed in the embodiment of FIG. 4.

FIG. 5 shows a conceptual implementation of an Upward Compressor.

Thus, the Input's Envelope 'E(t)' is detected, with a known per se envelope detector (see below).

The multiplying factor signal 'C(t)' is computed, such that if the Input is multiplied by 'C(t)' than it's modified Envelope will have a dynamic range 'r' times that of the original Envelope (in terms of dB). Thus $C(t)=(E(t)^{(r-1)})$ and $E(t)·C(t)=E(t)^r$ Since dB involves tacking the log of the amplitude the following equations are obtained:

$$log(E(t)·C(t))=log(E(t)^r)=r log(E(t))$$

Accordingly, expanding dynamic range (in dB) by a ratio r is equivalent to raising the energy envelope by a power of r. Having generated the 'C(t)' signal, it undergoes known per se, smoothing to thereby obtain a smooth, slow-varying function, which when multiplied by another signal, its effect on the frequency content is negligible.

In FIG. 6, there is shown a specific digital domain implementation.

There are various possible implementations of an upwards compressor in the digital domain, as is well known to those skilled in the art.

There follows a simplified implementation example that was found suitable in this specific example.

In this example the computations of signal 'C(n)' are implemented trough an approximation to the function '$X^{(r-1)}$' by means of a rational function, of the input In(n), to wit:

$$C(n) = \frac{(b0 + b1 \cdot \ln(n)^2 + b2 \cdot \ln(n)^4)}{(a0 + a1 \cdot \ln(n)^2 + a2 \cdot \ln(n)^4)}$$

This latter implementation brings about few goals at once: Envelope Detection Excessive-Gain protection and Initial smoothing.

Envelope Detection—simple envelope detectors are often implemented by full-wave-rectifier followed by a smoothing network. Since the rational function involves only even powers of 'In(n)', the need to rectify the input first is obviated.

Excessive-Gain protection—The function $X^{(r-1)}$, for r<1, can have very large value for X close to 0.0. Because the following smoothing stage has a non-zero response time, the fast rise of the signal from zero to a non-zero value can be subject to a very high gains. This is accomplished by using fast response time for the following smoothing stage. This however will result in the control signal having too much high frequency content, and such a Control Signal will affect not only the envelope, but also the frequency content of other signals controlled thereby. In the approximated function under consideration, the gain close to 0.0 is bounded by b0/a0.

Initial smoothing—The function $X^{(r-1)}$, for r<1, has a discontinuity around 0. This discontinuity also introduces high frequencies into the signal 'C(n)'. This can be coped with by excessive smoothing in the next stage—which as explained above stands in conflict to the need to for fast response for initial attacks (had we used the function $X^{(r-1)}$ being used as is). The proposed approximation function is fully continuous, and thus produces a control signal with less high frequencies, and the following smoothing stage need not to be a drastic one.

Figure 9:
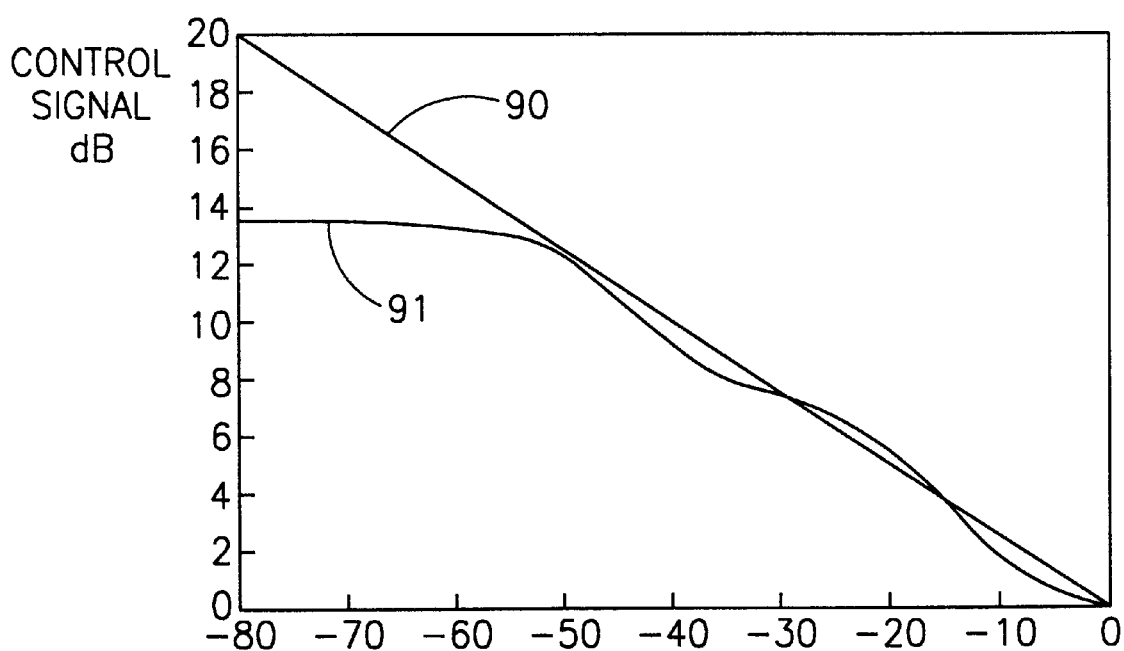
FIG. 9 shows graphically an example of a rational approximation to the desired compression law that is realized in the Upwards Compressor Logic of FIGS. 5 and 6.

A graph display of the function $X^{(r-1)}$ and our approximation is shown in FIG. 9.

For the case r=0.7649, and:

b0=0.02355287194791
b1=3.085399555809164e+002
b2=4.325457101218826e+003
a0=0.00510207976355
a1=1.401935898337816e+002
a2=4.493821917758144e+003

Having described the structure of the generator circuit in detail, the operation thereof will now be described, and in particular the manner in which the harmonics are developing, and how their dynamic range is controlled with reference, of course, to the Residue Expansion Ratio RR.

The input is represented as two time independent parts, to wit:

$$In(n)=E(n)\cdot F(n)$$

where E(n) is the energy envelope, and F(n) is the frequency content. E(n) is changing slower than F(n).

Thus, the result of multiplying the input by itself in multiplier (44) is:

$$In\cdot In=E^2\cdot F^2$$

Note that $E^2$ has a dynamic range that is expanded with ratio r=2 relative to E.

And that $F^2$ contains the 2'nd harmonics of F, DC and low frequency components that are filtered out by FB-HPF (45), and higher frequency intermodulation products that can be ignored.

Assuming that the circuit is initially activated, where the 1-sample-delay contains 0, and Control Signal is 1.0, the FBLoop Signal, develops at the respective outputs of mixer (52), gain (47) and output (42) will now be discussed.

Note also that the Upwards Compressor is mainly affected by the 'dominant' component at it's input. Thus, components with energies −12 dB down and bellow the 'dominant' component contribute little to the compressor's Control Signal.

Having said this, and further bearing in mind that the compressor is fed from the Out-HPF (50), it arises that the first harmonic whose frequency is above the Cutoff frequency of Out-HPF, once exists, becomes the dominant component of the PASignal, and thus is the main factor in the derivation of the Control Signal.

Two cases can be considered: one where the dominant component is the 2'nd harmonic of some frequency from the input signal, and another case where it is a 3'rd harmonic. In our specific example, the first case is relevant if the dominant component in the input is of frequency above 60 Hz, (so that it's second harmonic falls above 120 Hz) and the second case is for frequencies between 40 and 60 Hz, (where that second harmonics is below 120 Hz whereas the third harmonics exceeds the 120 Hz).

For simplicity, in the following discussion g=1 (g standing for the fixed FBLoop gain).

In a steady state where the 2'nd harmonic is the dominant one, it will have after the mixer (52) the form:

$$E^x\cdot F^2+E\cdot F$$

for some x that is the expansion ratio for the second harmonic.

After the Out-HPF, $E^x\cdot F^2$ is the dominant component, and accordingly the compressor Control Signal being:

$$CS=E^{x\cdot(r-1)}$$

So that after multiplication by CS, at the 1-sample-delay we obtain:

$$CS\cdot(E^x\cdot F^2+E\cdot F)=(E^x\cdot rF^2)+(E^{x\cdot(r-1)+1}\cdot F)$$

Following at the Multiplier (44) the fundamental component ($E^{x\cdot(r-1)+1}\cdot F$) will now become the 2'nd harmonic, to wit:

$$(E^x=E^{x\cdot(r-1)+1+1}\cdot F^2);$$

The solution for the stead state results in:

$$E^x=E^{x\cdot(r-1)+1+1};$$

$$x=x(r-1)+2;$$

$$x=\frac{2}{(2-r)}$$

Now, if the 2'nd harmonic after the mixer (52) (i.e. $E^x\cdot F^2$), is dominant term, than at the following final output, after multiplication by CS (49) is obtained:

$$E^{x\cdot r}\cdot F^2;$$

So that x·r is the expansion ratio of the second harmonic at the output, and this should be set equal to the Residue Expansion Ratio for the 2'nd harmonic as discussed in detail above (Table 1) i.e. about 1.34. Solving for: xr=1.34; and $$x=\frac{2}{(2-r)}$$

we get:

$$\frac{2\cdot r}{(2-r)}=1.34;$$

r=0.802.

So the upwards compressor ratio that will result in a steady state Residue Expansion Ratio of the 2'nd of 1.34 is 0.802.

Turning now to the second case where the 3'rd harmonic is the dominant one, i.e. the first harmonic that exceeds 120 Hz, we obtain $$x=\frac{3}{(3-2\cdot r)}.$$

As discussed in detail above (Table 1) Residue Expansion Ratio for the 3'rd harmonic to be: x·r=1.74.

Resolving r give rise to:

$$\frac{3\cdot r}{(3-2\cdot r)}=1.74;$$

r=0.805.

It readily arises from the foregoing that the solution for the Compression ratio 'r' for the 2'nd and 3'rd harmonic cases is very close. If we use r=0.802 for the 3'rd harmonic equation we get:

$$x=\frac{3\cdot 0.802}{(3-2\cdot 0.802)}=1.72.$$

Thus, one constant upwards-compression ratio of about 0.8 can result in the correct Residue Expansion Ratio both when the 2'nd or 3'rd harmonics are the dominant ones.

In the foregoing approximated analysis, the effect of other than the dominant harmonic on the derivation of the Control Signal by the Upwards Compressor is neglected. In practice the other—non dominant—harmonics do contribute some to the envelope detected by the compressor, and since these are always higher harmonics, their contribution is to expand the envelope at the input to the compressor, relative to that of the dominant harmonic by itself. The effect of that is that slightly more compression is actually needed. Subjective listening showed that values around 0.75–0.8 yield good results.

In the analysis above g has assigned the value 1. For the dominant harmonics only a constant change in gain, that can be compensated for outside of the generator.

For the higher harmonics it can be shown to control the rate of dumping of the harmonics—as higher harmonics are generated trough more circulation's trough the FBLoop. So in fact 'g' serves as a way to control the perceived timbre of the PA-Signal, trough controlling the rate at which higher harmonics (than the first harmonic above f3), are attenuated.

Note that since 'g' is part of the FBLoop, the rate at which harmonics are attenuated is not simply $g^N$, but is tamed by the 'upwards compression' that is applied recursively within the FBLoop. Accordingly, g should be set to a value of less than 1 in order to duly attenuate harmonics that fall in the second group of harmonics. A value of about g=0.3 was found satisfactory.

The description with reference to FIGS. 4 to 8 illustrated one out of many possible variants of embodiments for realizing a PA signal generator based on Residue Expansion Ratio approach for realizing loudness matching. Of course other hardware and/or software realizations for attaining the same goals are application.

The present invention encompasses also other loudness matching techniques as illustrated schematically in FIGS. 3*a*, 3*b*, 3*c*.

It should be noted that whereas the description that pertains to FIGS. 4 to 9 exemplified precise loudness matching (i.e. the residue expansion ratio was selected to be approximately 1.34 for dominant second harmonics and approximately 1.74 for dominant third harmonics). This by no means constitute a pre-requisite. In other words, an essentially loudness matching is also sufficient. Accordingly, and as will be explained in greater detail below, expansion ratio, (i.e. modified residue expansion ratio) that falls in the range of about ±50% of the above ratios is tolerated.

Thus in the discussion above, the principles, and methods for achieving the Loudness Matching criteria between the Low-Frequency-Signal-of-interest and the Psychoacoustic-Alternative-Signal were described.

An approximated ratio (the residue expansion ratio) by which the PASignal dynamic range should be expanded relative to the LFSignal, was presented. This approximated residue expansion ratio is referred to as the "Natural" ratio. There follows an explanation why, in practice, a range of ratios (i.e. modified ratio around the 'Natural' ratio) can provide useful and desired results.

Intentional compression of sound's dynamic range is desirable in many practical situations such as:

1. When the media carrying the sound is technically limited in dynamic range such as:
   1.1 radio or TV transmission;
   1.2 tape cassettes with limited dynamic range;
   1.3 MultiMedia 8 bits files, and such; or
2. When the sound is (to be) reproduced in an environment with a relatively high background noise, that masks signals of low level, for example:
   2.1 in a car;
   2.2 in a shopping mall;
   2.3 environments with machinery; or
3. Specifically regarding bass sounds (low frequencies) dynamic range compression is sometimes desired as a subjective 'effect' in some kinds of pop music.

In the context of this invention, for all the above examples, the compression of the PASignal can be done as part of the PASignal generation process—simply by applying a different (other than the natural) expansion ratio between the LFSignal and PASignal.

In the above examples compression ratio of as such as 1:2 can be desired, and thus, generally, a residue expansion ratio that falls in the range of RR(f,n)±50% is embraced by the following invention.

In the claim which follow, alphabetic characters used to designate claim steps are provided for convenience of description only, and do not necessarily imply any particular order of performing the steps.

The present invention has been described with a certain degree of particularity but it should be understood that various modifications and alteration may be made without departing from the scope or spirit of the invention as defined by the following claims:

We claim:

1. A method for conveying to a listener a pseudo low frequency psycho-acoustic sensation (Pseudo-LFPS) of a sound signal, comprising steps of:
   (i) deriving from the sound signal, a high frequency signal and a low frequency signal (LF signal) that extends over a low frequency range of interest;
   (ii) for each fundamental frequency within the low frequency range of interest, generating a residue harmonic signal having a sequence of harmonics;
   said sequence of harmonics, generated with respect to each fundamental frequency containing a first group of harmonics that includes at least three consecutive harmonics from among a primary set of harmonics of the fundamental frequency;
   (iii) bringing the loudness of said residue harmonic signal to essentially match the loudness of said low frequency signal; and
   (iv) summing the residue harmonic signal and said high frequency signal so as to obtain psychoacoustic alternative signal.

2. The method of claim 1, further comprising the step of:
   removing a direct current (DC) constituent that would otherwise reside in the psychoacoustic alternative signal.

3. The method of claim 1, further comprising the step of:
   (v) summing said low frequency range signal, or portion thereof so as to obtain said psychoacoustic alternative signal.

4. The method of claim 1 wherein the sequence of harmonics generated with respect to at least one of said fundamental frequency, further contain secondary group of harmonics having significantly lower energy compared to the first set of harmonics of said fundamental frequency.

5. A method according to claim 1, wherein said low frequency signal is wholly contained in a bass frequency range.

6. A method according to claim 1, wherein said low frequency signal partially overlaps said bass frequency range.

7. A method according to claim 1, further comprising a step of: treating the sound signal as part of an audio production process such that it conveys to a listener a pseudo-LFPS.

8. A method according to claim 1, further comprising a step of: treating the sound signal as part of a sound signal broadcasting process such that it conveys to a listener a pseudo-LFPS.

9. A method according to claim 1, further comprising a step of: treating the sound signal as part of a sound signal production process such that it conveys to a listener a pseudo-LFPS.

10. A method according to claim 9, wherein said reproducing is incorporated in at least one of the following components amplifier and electro-acoustic transducer.

11. A method for conveying to a listener a pseudo low frequency psycho-acoustic sensation (Pseudo-LFPS) of a sound signal, comprising steps of:
  (i) deriving from the sound signal, a high frequency signal and a low frequency signal (LF signal) that extends over a low frequency range of interest;
  (ii) for each fundamental frequency within the low frequency range of interest, generating a residue harmonic signal having a sequence of harmonics;
  said sequence of harmonics, generated with respect to each fundamental frequency containing a first group of harmonics that includes at least three consecutive harmonics from among a primary set of harmonics of the fundamental frequency;
  (iii) bringing said low frequency signal and said residue harmonic signal into essentially loudness matching such that $$E_h = E_f \cdot RR'(f_f, N) + K$$

where:
  $f_f$=fundamental frequency in said LFsignal
  $E_f$=energy (in dB) of said fundamental frequency in said LFSignal
  $E_h$=energy (in dB) of RHSignal with respect to $f_f$
  RR'(ff,N)=RR(f,N)+−50%, the modified residue expansion ratio between ff and its N'th harmonics, according to the formulas that are described later.
  N=Nth harmonics of said fundamental frequency, being the dominant harmonics above fc
  $f_c$=critical frequency of said LFsignal
  (iv) summing the residue harmonic signal and said high frequency signal so as to obtain psychoacoustic alternative signal.

12. An apparatus for conveying to a listener a pseudo low frequency psycho-acoustic sensation (Pseudo-LFPS) of a sound signal, comprising:
  frequency unit capable of deriving from the sound signal, a high frequency signal and a low frequency signal (LF signal) that extends over a low frequency range of interest;
  harmonics generator coupled to said frequency generator capable of generating, for each fundamental frequency within the low frequency range of interest, a residue harmonic signal having a sequence of harmonics;
  said sequence of harmonics, generated with respect to each fundamental frequency containing a first group of harmonics that includes at least three consecutive harmonics from among a primary set of harmonics of the fundamental frequency;
  loudness matcher coupled to said harmonics generator capable of bringing the loudness of said residue harmonic signal to essentially match the loudness of said low frequency signal; and
  summation unit capable of summing the residue harmonic signal and said high frequency signal so as to obtain psychoacoustic alternative signal.

13. The apparatus of claim 12, further comprising:
  DC remover for removing a direct current (DC) constituent that would otherwise reside in the psychoacoustic alternative signal.

14. The apparatus of claim 12, further comprising:
  second summation unit for summing said low frequency range signal, or portion thereof so as to obtain said psychoacoustic alternative signal.

15. The apparatus of claim 12 wherein the sequence of harmonics generated with respect to at least one of said fundamental frequency, further contain secondary group of harmonics having significantly lower energy compared to the first set of harmonics of said fundamental frequency.

16. The apparatus of claim 12, wherein said low frequency signal is wholly contained in a bass frequency range.

17. The apparatus of claim 12, wherein said low frequency signal partially overlaps said bass frequency range.

18. The apparatus of claim 12, wherein the apparatus is used in an audio production system for conveying to a listener a pseudo-LFPS.

19. The apparatus of claim 12, wherein the apparatus is used in a sound signal broadcasting system for conveying to a listener a pseudo-LFPS.

20. The apparatus of claim 12, wherein the apparatus is used in a sound signal reproduction system for conveying to a listener a pseudo-LFPS.

21. The apparatus of claim 12, wherein the apparatus is used in an amplifier of a sound signal reproduction system for conveying to a listener a pseudo-LFPS.

22. The apparatus of claim 12, wherein the apparatus is used in electro-acoustic transducer of a sound signal reproduction system for conveying to a listener a pseudo-LFPS.

23. An apparatus for conveying to a listener a pseudo low frequency psycho-acoustic sensation (Pseudo-LFPS) of a sound signal, comprising:
  frequency unit capable of deriving from the sound signal, a high frequency signal and a low frequency signal (LF signal) that extends over a low frequency range of interest;
  harmonics generator coupled to said frequency generator capable of generating, for each fundamental frequency within the low frequency range of interest, a residue harmonic signal having a sequence of harmonics;
  said sequence of harmonics, generated with respect to each fundamental frequency containing a first group of harmonics that includes at least three consecutive harmonics from among a primary set of harmonics of the fundamental frequency;
  loudness matcher coupled to said harmonics generator capable of bringing the loudness of said residue harmonic signal to essentially match the loudness of said low frequency signal, such that:
  bringing said low frequency signal and said residue harmonic signal into essentially loudness matching such that $$E_h = E_f \cdot RR'(f_f, N) + K$$

where:
  $f_f$=fundamental frequency in said LFsignal
  $E_f$=energy (in dB) of said fundamental frequency in said LFSignal
  $E_h$=energy (in dB) of RHSignal with respect to $f_f$
  RR'(ff,N)=RR(f,N)+−50%, the modified residue expansion ratio between ff and its N'th harmonics, according to the formulas that are described later.
  N=Nth harmonics of said fundamental frequency, being the dominant harmonics above fc
  $f_c$=critical frequency of said LFsignal
  summation unit capable of summing the residue harmonic signal and said high frequency signal so as to obtain psychoacoustic alternative signal.

* * * * *